United States Patent
Oohiraki et al.

(10) Patent No.: US 10,453,772 B2
(45) Date of Patent: Oct. 22, 2019

(54) HEAT-SINK-ATTACHED POWER-MODULE SUBSTRATE AND POWER MODULE

(71) Applicant: MITSUBISHI MATERIALS CORPORATION, Tokyo (JP)

(72) Inventors: Tomoya Oohiraki, Saitama (JP); Sotaro Oi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/766,391

(22) PCT Filed: Oct. 3, 2016

(86) PCT No.: PCT/JP2016/079307
§ 371 (c)(1),
(2) Date: Apr. 6, 2018

(87) PCT Pub. No.: WO2017/061379
PCT Pub. Date: Apr. 13, 2017

(65) Prior Publication Data
US 2018/0301391 A1    Oct. 18, 2018

(30) Foreign Application Priority Data
Oct. 8, 2015 (JP) .................. 2015-200003

(51) Int. Cl.
*H01L 23/373*   (2006.01)
*H01L 25/07*    (2006.01)
(Continued)

(52) U.S. Cl.
CPC .......... *H01L 23/3735* (2013.01); *C04B 37/00* (2013.01); *F28F 3/00* (2013.01);
(Continued)

(58) Field of Classification Search
CPC .................................................. H01L 23/3735
(Continued)

(56) References Cited

U.S. PATENT DOCUMENTS
2012/0182692 A1   7/2012   Mori et al.

FOREIGN PATENT DOCUMENTS
JP    2003-168770 A   6/2003
JP    2007-013028 A   1/2007
(Continued)

OTHER PUBLICATIONS
International Search Report dated Nov. 15, 2016, issued for PCT/JP2016/079307.
(Continued)

*Primary Examiner* — Hsin Yi Hsieh
(74) *Attorney, Agent, or Firm* — Locke Lord LLP

(57) ABSTRACT

Provided is a heat-sink-attached power-module substrate, in which a metal layer and first layers are formed from aluminum sheets having a purity of 99.99 mass % or greater and a heat sink and second layers are formed from aluminum sheets having a purity lower than that of the metal layer and the first layers: when a thickness is t1 (mm), a joined-surface area is A1 (mm2), yield strength at 25° C. is σ11 (N/mm2), yield strength at 200° C. is σ12 (N/mm2) in the second layers; a thickness is t2 (mm), a joined-surface area is A2 (mm2), yield strength at 25° C. is σ21 (N/mm2), and yield strength at 200° C. is σ22 (N/mm2) in the heat sink.

20 Claims, 12 Drawing Sheets

(51) Int. Cl.
  *H01L 25/18* (2006.01)
  *F28F 3/00* (2006.01)
  *H01L 21/48* (2006.01)
  *C04B 37/00* (2006.01)
  *F28F 21/08* (2006.01)

(52) U.S. Cl.
  CPC .......... *H01L 21/4882* (2013.01); *H01L 25/07* (2013.01); *H01L 25/18* (2013.01); *F28F 21/084* (2013.01)

(58) Field of Classification Search
  USPC ....................................................... 257/703
  See application file for complete search history.

(56) References Cited

FOREIGN PATENT DOCUMENTS

| | | |
|---|---|---|
| JP | 2009-065144 A | 3/2009 |
| JP | 2012-146864 A | 8/2012 |
| JP | 2012-160548 A | 8/2012 |
| JP | 2012-191004 A | 10/2012 |
| JP | 2014-160763 A | 9/2014 |
| JP | 2014-160764 A | 9/2014 |
| JP | 2014-192408 A | 10/2014 |

OTHER PUBLICATIONS

Supplementary European Search Report dated Jun. 4, 2019, issued for the European patent application No. 16853533.4.

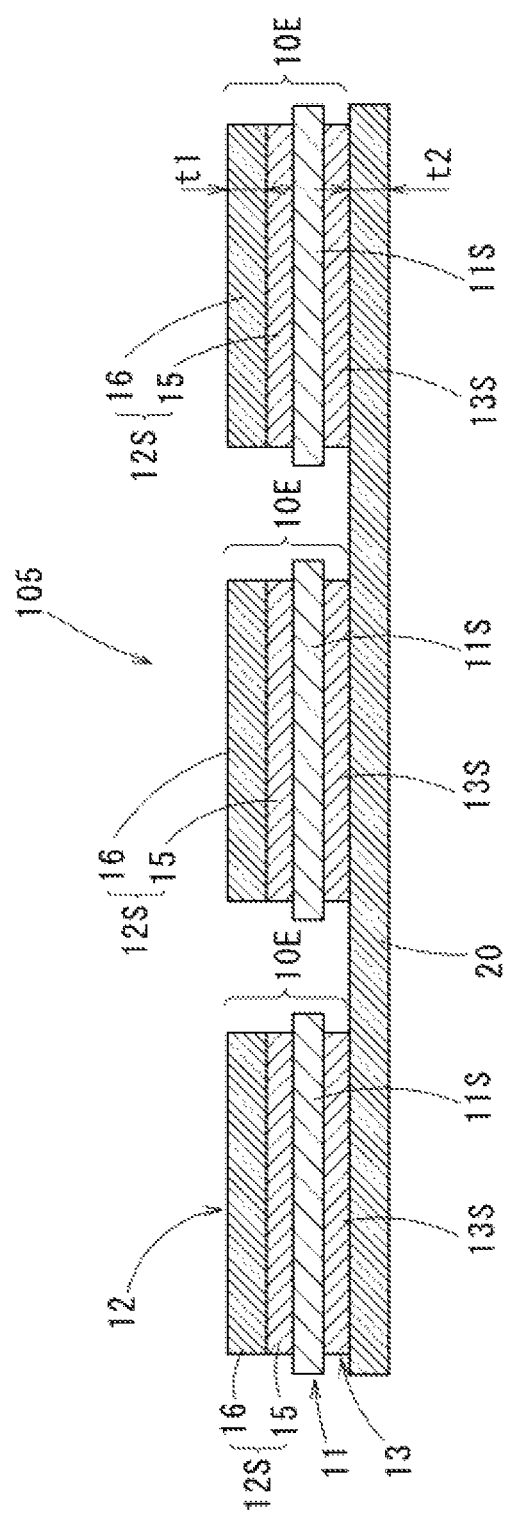

HEAT-SINK-ATTACHED POWER-MODULE SUBSTRATE AND POWER MODULE

TECHNICAL FIELD

The present invention relates to a heat-sink-attached power-module substrate and a power module used for a semiconductor device controlling a large electric current and a high voltage.

Priority is claimed on Japanese Application No. 2015-200003, filed on Oct. 8, 2015, the content of which is incorporated herein by reference.

BACKGROUND ART

A power-module substrate with a heat sink is used for a power module for a vehicle, in which aluminum plates are joined on a ceramic substrate including aluminum nitride or the like, and an aluminum-based heat sink is joined on one side with the aluminum plate therebetween.

Such a power-module substrate with a heat sink is conventionally manufactured as followings. First, two aluminum plates are stacked on two surfaces of a ceramic substrate with interposing brazing material which is suitable for bonding the ceramic substrate and the aluminum plates therebetween, heating them to a temperature melting the brazing material or higher with pressing them at a prescribed pressure force, so that the ceramic substrate and the aluminum plates on both the surfaces are bonded. Next, on one of the aluminum plates, a heat sink is stacked with interposing brazing material which is suitable for bonding the aluminum plate and the heat sink therebetween, heating them to a temperature melting the brazing material or higher with pressing them at a prescribed pressure force, so that the aluminum plate and the heat sink are bonded. Thereby, manufacturing the power-module substrate with the heat sink.

In the above-mentioned power-module substrate with a heat sink, one of the aluminum plates is formed as a circuit layer on which semiconductor elements such as a power element and a like are mounted with interposing solder material.

In the above-mentioned power-module substrate, it is necessary that a warp be small because a heat radiation property and the like are deteriorated if there is a warp.

Conventionally, there are arts described in Patent Documents 1 and 2 for example as arts for reducing a warp and the like of a power-module substrate.

A power-module substrate described in Patent Document 1 is provided with a metal plate as a circuit layer made of a clad material. The clad material is formed by stacking two or more layers including a first layer with an aluminum purity of 99.0 mass % to 99.95 mass % inclusive and a second layer with an aluminum purity of 99.99 mass % or higher. The second layer is bonded on a ceramic substrate. It is described that a circuit layer thickness is 600 µm and a metal layer to be provided at a back surface to the circuit layer of the ceramic substrate has a thickness of 400 µm.

Patent Document 2 discloses a silicon nitride circuit substrate in which a metal clad material is bonded on at least one of surfaces of a silicon nitride substrate. It is also disclosed that a combination of an electric conductive material such as a Cu plate, Al plate and the like and a low thermal-expansion metal such as a kovar plate, a tungsten plate and the like is suitable as the metal clad material.

PRIOR ART DOCUMENTS

Patent Documents

Patent Document 1: Japanese Unexamined Patent Application, First Publication No. 2012-191004
Patent Document 2: Japanese Unexamined Patent Application, First Publication No. 2003-168770

SUMMARY OF INVENTION

Technical Problem to be Solved by Invention

The conventional power-module substrate with a heat sink attempts to solve mainly a problem of reducing an initial warp owing to a linear thermal expansion difference between an insulate substrate and a heat sink when bonding the heat sink. However, warp may generated by a temperature change, by heating in a mounting process of a semiconductor element after bonding the heat sink or in an usage environment.

If the warp is generated in the mounting process, a position of a soldering joint part may be shifted, or a deformation and cracks may be generated at the joint part, so that there may be a problem of deterioration in a bonding reliability. If the warp is generated in the usage environment, a thermal conductive grease between the heat sink and a cooler may be flown out from between the heat sink and the cooler because of a pump-out phenomenon, so it may be impossible to contact the heat sink and the cooler with each other and a thermal resistance may be increased.

The present invention is achieved in consideration of the above circumstances, and has an object to provide a power-module substrate with a heat sink and a power module in which an initial warp after bonding with the heat sink is small, and furthermore a warp is small even in a mounting process of a semiconductor element and even in an usage environment.

Solution to Problem

A heat-sink-attached power-module substrate according to the present invention includes: one sheet of ceramic substrate; a circuit layer formed from a plurality of small-circuit layers which are bonded on one surface of the ceramic substrate with spacing each other; one sheet of metal layer bonded on the other surface of the ceramic substrate; a power-module substrate provided with the ceramic substrate, the circuit layer and the metal layer; and one sheet of heat sink bonded on the metal layer of the power-module substrate. In this heat-sink-attached power-module substrate, each of the small-circuit layers has a stacking structure configured from a first layer bonded on the ceramic substrate and a second layer bonded on a surface of the first layer: the metal layer and the first layers are formed from aluminum sheets having a purity of 99.99 mass % or greater: the heat sink and the second layers are formed from aluminum sheets having a purity lower than that of the metal layer and the first layers: when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$); and a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$), a ratio (t1×A1×σ11)/(t2×A2×

$\sigma 21$) at 25° C. is 0.85 to 1.40 inclusive; and a ratio $(t1 \times A1 \times \sigma 12)/(t2 \times A2 \times \sigma 22)$ at 200° C. is greater than 1.0 fold but no more than 1.4 fold as the ratio at 25° C.

The second layers made of the aluminum sheets having the higher aluminum purity and higher rigidity are disposed at a side counter to the heat sink made of aluminum having the low purity and high rigidity, i.e., high yield strength so as to form the stacking structure of the first layers and the second layers as the circuit layer. Thereby, configuring a symmetrical structure about the ceramic substrate between the heat sink and the second layers of the circuit layer, so that two surfaces of the ceramic substrate are prevented from acting uneven stresses on while heating or the like: as a result, a warp of the heat-sink-attached power-module substrate can be prevented. Moreover, using the aluminum sheets having the purity of 99.99 mass % or higher for the first layers and the metal layer which are bonded on the ceramic substrate, since the aluminum sheets is relatively soft, i.e., the yield strength is low, it is possible to prevent breakages on the ceramic substrate by reducing thermal stress on the ceramic substrate while heating or the like.

A bending stress by the heat sink on the ceramic substrate is larger than a bending stress by the circuit layer because the heat sink is one sheet and the circuit layer is formed from the plurality of small-circuit layers. Accordingly, in order to reduce change of a warp amount along with temperature change, an opposing stress to the bending stress by the heat sink is necessary on the circuit layer side. Therefore, in the present invention, by controlling a relation at room temperature 25° C. between the second layers of the circuit layer and the heat sink to the above-described ratio range at 25° C., the warp at 25° C. is reduced: moreover, by controlling a ratio at 200° C. to larger than 1.0 fold but not larger than 1.4 fold as the ratio at 25° C., the bending stress at the circuit layer side at 200° C. is larger than that at 25° C. in this structure when the heat-sink-attached power-module substrate is heated. Accordingly, it is possible to reduce the change of the warp amount in a temperature range between 25° C. to 200° C., so that the symmetrical property about the ceramic substrate can be stably maintained even when heated.

As described above, in a case in which the circuit layer is patterned such a case in which the plurality of small-circuit layers are arranged on the ceramic substrate of the heat-sink-attached power-module substrate, a shape of a joint part of the circuit layer bonded on the ceramic substrate is different from a shape of a joint part of the heat sink bonded on the ceramic substrate. However, considering the symmetry of the rigidity of the second layers and the rigidity of the heat sink, it is possible to reliably prevent the warp. Moreover, considering the symmetry of the rigidity of the second layers and the rigidity of the heat sink at both times of the room temperature 25° C. and the heating temperature 200° C., and setting the ratio at 200° C. to be larger than the ratio at 25° C., it is possible to reduce the change amount of warp along with the temperature change of 25° C. to 200° C.: the warp can be reduced in the mounting process of the semiconductor element and in the usage environment not only the initial warp after bonding with the heat sink. Accordingly, reliability as an insulate substrate can be improved and a favorable heat-radiation property can be shown. In addition, according to the heat-sink-attached power-module substrate of the present invention, since the plurality of small-circuit layers are bonded on one sheet of the heat sink, it is possible to accurately position the small-circuit layers and highly-integrate.

A heat-sink-attached power-module substrate according to the present invention may include one sheet of ceramic substrate; a circuit layer formed from a plurality of small-circuit layers which are bonded on one surface of the ceramic substrate spacing each other; one sheet of metal layer bonded on the other surface of the ceramic substrate; a power-module substrate provided with the ceramic substrate, the circuit layer and the metal layer; and one sheet of heat sink bonded on the metal layer in the power-module substrate. In this power-module substrate, it is acceptable that: each of the small-circuit layers has a stacking structure configured from a first layer bonded on the ceramic substrate, a circuit-side bonding-core member bonded on a surface of the first layer, and a second layer bonded on a surface of the circuit-side bonding-core member: the metal layer and the first layers are formed from aluminum sheets having a purity of 99.99 mass % or greater: the heat sink and the second layers are formed from aluminum sheets having a purity lower than that of the metal layer and the first layers: the circuit-side bonding-core members are formed from aluminum alloy sheets: when a thickness of the second layers is t1 (mm), a sum total of joined-surface areas of the second layers is A1 (mm$^2$), yield strength of the second layers at 25° C. is $\sigma 11$ (N/mm$^2$), and yield strength of the second layers at 200° C. is $\sigma 12$ (N/mm$^2$); a thickness of the heat sink is t2 (mm), a joined-surface area of the heat sink is A2 (mm$^2$), yield strength of the heat sink at 25° C. is $\sigma 21$ (N/mm$^2$), and yield strength of the heat sink at 200° C. is $\sigma 22$ (N/mm$^2$); and a thickness of the circuit-side bonding-core members is t3 (mm), a sum total of joined-surface areas of the respective circuit-side bonding-core members and first layers is A3 (mm$^2$), yield strength of the circuit-side bonding-core members at 25° C. is $\sigma 31$ (N/mm$^2$), and yield strength of the circuit-side bonding-core members at 200° C. is $\sigma 32$ (N/mm$^2$), a ratio $(t1 \times A1 \times \sigma 11 + t3 \times A3 \times \sigma 31)/(t2 \times A2 \times \sigma 21)$ at 25° C. is 0.85 to 1.40 inclusive; and a ratio $(t1 \times A1 \times \sigma 12 + t3 \times A3 \times \sigma 32)/(t2 \times A2 \times \sigma 22)$ at 200° C. is greater than 1.0 fold but no more than 1.4 fold as the ratio at 25° C.

A heat-sink-attached power-module substrate of the present invention may include one sheet of ceramic substrate; a circuit layer formed from a plurality of small-circuit layers which are bonded on one surface of the ceramic substrate spacing each other; one sheet of metal layer bonded on the other surface of the ceramic substrate; a power-module substrate provided with the ceramic substrate, the circuit layer and the metal layer; and one sheet of heat sink bonded on the metal layer in the power-module substrate with one sheet of heat-radiation-side bonding-core member therebetween. In this power-module substrate, it is acceptable that: each of the small-circuit layers has a stacking structure configured from a first layer bonded on the ceramic substrate and a second layer bonded on a surface of the first layer: the metal layer and the first layers are formed from aluminum sheets having a purity of 99.99 mass % or greater: the heat sink and the second layers are formed from aluminum sheets having a purity lower than that of the metal layer and the first layers: the heat-radiation-side bonding-core member is formed from an aluminum-alloy sheet: when a thickness of the second layers is t1 (mm), a sum total of joined-surface areas of the second layers is A1 (mm$^2$), yield strength of the second layers at 25° C. is $\sigma 11$ (N/mm$^2$), and yield strength of the second layers at 200° C. is $\sigma 12$; a thickness of the heat sink is t2 (mm), a joined-surface area of the heat sink is A2 (mm$^2$), yield strength of the heat sink at 25° C. is $\sigma 21$ (N/mm$^2$), and yield strength of the heat sink at 200° C. is $\sigma 22$ (N/mm$^2$); and a thickness of the heat-radiation-side bonding-core member is t4 (mm), a joined-surface area of the heat-radiation-side bonding-core member and the metal layer is A4 (mm$^2$), yield strength of the heat-radiation-side bonding-core member at 25° C. is σ41 (N/mm$^2$), and yield strength of the heat-radiation-side bonding-core member at 200° C. is σ42 (N/mm$^2$), a ratio (t1×A1×σ11)/(t2×A2×σ21+t4×A4×σ41) at 25° C. is 0.85 to 1.40 inclusive; and a ratio (t1×A1×σ12)/(t2×A2×σ22+t4×A4×σ42) at 200° C. is greater than 1.0 fold but no more than 1.4 fold as the ratio at 25° C.

A heat-sink-attached power-module substrate of the present invention may include one sheet of ceramic substrate; a circuit layer formed from a plurality of small-circuit layers which are bonded on one surface of the ceramic substrate spacing each other; one sheet of metal layer bonded on the other surface of the ceramic substrate; a power-module substrate provided with the ceramic substrate, the circuit layer and the metal layer; and one sheet of heat sink bonded on the metal layer in the power-module substrate with one sheet of heat-radiation-side bonding-core member therebetween. In this power-module substrate, it is acceptable that: each of the small-circuit layers has a stacking structure configured from a first layer bonded on the ceramic substrate, a circuit-side bonding-core member bonded on a surface of the first layer, and a second layer bonded on a surface of the circuit-side bonding-core member: the metal layer and the first layers are formed from aluminum sheets having a purity of 99.99 mass % or greater: the heat sink and the second layers are formed from aluminum sheets having a purity lower than that of the metal layer and the first layers: the heat-radiation-side bonding-core member and the circuit-side bonding-core members are formed from aluminum-alloy sheets: when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$); a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$); a thickness of the circuit-side bonding-core members is t3 (mm), a sum total of joined-surface areas of the respective circuit-side bonding-core members and the first layers is A3 (mm$^2$), yield strength of the circuit-side bonding-core members at 25° C. is σ31 (N/mm$^2$), and yield strength of the circuit-side bonding-core members at 200° C. is σ32 (N/mm$^2$); and a thickness of the heat-radiation-side bonding-core member is t4 (mm), a joined-surface area of the heat-radiation-side bonding-core member and the metal layer is A4 (mm$^2$), yield strength of the heat-radiation-side bonding-core member at 25° C. is σ41 (N/mm$^2$), and yield strength of the heat-radiation-side bonding-core member at 200° C. is σ42 (N/mm$^2$), a ratio (t1×A1×σ11+t3×A3×σ31)/(t2×A2×σ21+t4×A4×σ41) at 25° C. is 0.85 to 1.40 inclusive; and a ratio (t1×A1×σ12+t3×A3×σ32)/(t2×A2×σ22+t4×A4×σ42) at 200° C. is greater than 1.0 fold but no more than 1.4 fold as the ratio at 25° C.

A heat-sink-attached power-module substrate of the present invention includes a plurality of power-module substrates and one sheet of heat sink on which the power-module substrates are bonded with spacing each other. Each of the power-module substrates is provided with a small-ceramic substrate, a small-circuit layer bonded on one surface of the small-ceramic substrate and a small-metal layer bonded on the other surface of the small-ceramic layer. The respective small-metal layers of the power-module substrates are bonded on the heat sink; each of the small-circuit layers has a stacking structure configured from a first layer bonded on the small-ceramic substrate and a second layer bonded on a surface of the first layer; the small-metal layers and the first layers are formed from aluminum sheets having a purity of 99.99 mass % or greater; the heat sink and the second layers are formed from aluminum sheets having a purity lower than that of the small-metal layers and the first layers. When a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$); and a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$), a ratio (t1×A1×σ11)/(t2×A2×σ21) at 25° C. is 0.85 to 1.40 inclusive; and a ratio (t1×A1×σ12)/(t2×A2×σ22) at 200° C. is greater than 1.0 fold but no more than 1.4 fold as the ratio at 25° C.

A heat-sink-attached power-module substrate of the present invention may include a plurality of power-module substrates and one sheet of heat sink on which the power-module substrates are bonded with spacing each other. It is acceptable that: each of the power-module substrates is provided with a small-ceramic substrate, a small-circuit layer bonded on one surface of the small-ceramic substrate and a small-metal layer bonded on the other surface of the small-ceramic substrate. The respective small-metal layers of the power-module substrates are bonded on the heat sink; each of the small-circuit layers has a stacking structure configured from a first layer bonded on the small-ceramic substrate, a circuit-side bonding-core member bonded on a surface of the first layer and a second layer bonded on a surface of the circuit-side boning-core member; the small-metal layers and the first layers are formed from aluminum sheets having a purity of 99.99 mass % or greater, the heat sink and the second layers are formed from aluminum sheets having a purity lower than that of the small-metal layers and the first layers, the circuit-side bonding-core members are formed from aluminum-alloy sheets, when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$); a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$); and a thickness of the circuit-side bonding-core members is t3 (mm), a sum total of joined-surface areas of the respective circuit-side bonding-core members and first layers is A3 (mm$^2$), yield strength of the circuit-side bonding-core members at 25° C. is σ31 (N/mm$^2$), and yield strength of the circuit-side bonding-core members at 200° C. is σ32 (N/mm$^2$), a ratio (t1×A1×σ11+t3×A3×σ31)/(t2×A2×σ21) at 25° C. is 0.85 to 1.40 inclusive; and a ratio (t1×A1×σ12+t3×A3×σ32)/(t2×A2×σ22) at 200° C. is greater than 1.0 fold but no more than 1.4 fold as the ratio at 25° C.

A heat-sink-attached power-module substrate of the present invention may include a plurality of power-module substrates and one sheet of heat sink on which the power-module substrates are bonded with spacing each other. It is acceptable that: each of the power-module substrates is provided with a small-ceramic substrate, a small-circuit layer bonded on one surface of the small-ceramic substrate, a small-metal layer bonded on the other surface of the small-ceramic substrate; the respective small-metal layers of the power-module substrates are bonded on the heat sink with interposing heat-radiation-side bonding-core members therebetween; each of the small-circuit layers has a stacking structure configured from a first layer bonded on the small-ceramic substrate and a second layer bonded on a surface of the first layer; the small-metal layers and the first layers are formed from aluminum sheets having a purity of 99.99 mass % or greater; the heat sink and the second layers are formed from aluminum sheets having a purity lower than that of the small-metal layers and the first layers; and the heat-radiation-side bonding-core members are formed from aluminum-ally sheets; when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12; a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$); and a thickness of the heat-radiation-side bonding-core members is t4 (mm), a sum total of joined-surface areas of the respective heat-radiation-side bonding-core members and the small-metal layers is A4 (mm$^2$), yield strength of the heat-radiation-side bonding-core members at 25° C. is σ41 (N/mm$^2$), and yield strength of the heat-radiation-side bonding-core members at 200° C. is σ42 (N/mm$^2$), a ratio (t1×A1×σ11)/(t2×A2×σ21+t4×A4×σ41) at 25° C. is 0.85 to 1.40 inclusive; and a ratio (t1×A1×σ12)/(t2×A2×σ22+t4×A4×σ42) at 200° C. is greater than 1.0 fold but no more than 1.4 fold as the ratio at 25° C.

A heat-sink-attached power-module substrate of the present invention may include a plurality of power-module substrates and one sheet of heat sink on which the power-module substrates are bonded with spacing each other. It is acceptable that: each of the power-module substrates is provided with a small-ceramic substrate, a small-circuit layer bonded on one surface of the small-ceramic substrate, and a small-metal layer bonded on the other surface of the small-ceramic substrate; the respective small-metal layers of the power-module substrates are bonded on the heat sink with interposing heat-radiation-side bonding-core members therebetween; each of the small-circuit layers has a stacking structure configured from a first layer bonded on the small-ceramic substrate, a circuit-side bonding-core member bonded on a surface of the first layer, and a second layer bonded on a surface of the circuit-side bonding-core member; the small-metal layers and the first layers are formed from aluminum sheets having a purity of 99.99 mass % or greater; the heat sink and the second layers are formed from aluminum sheets having a purity lower than that of the small-metal layers and the first layers; the heat-radiation-side bonding-core members and the circuit-side bonding-core members are formed from aluminum-alloy sheets; when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$); a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$); a thickness of the circuit-side bonding-core members is t3 (mm), a sum total of joined-surface areas of the respective circuit-side bonding-core members and the first layers is A3 (mm$^2$), yield strength of the circuit-side bonding-core members at 25° C. is σ31 (N/mm$^2$), and yield strength of the circuit-side bonding-core members at 200° C. is σ32 (N/mm$^2$); and a thickness of the heat-radiation-side bonding-core members is t4 (mm), a sum total of joined-surface areas of the respective heat-radiation-side bonding-core members and the small-metal layers is A4 (mm$^2$), yield strength of the heat-radiation-side bonding-core members at 25° C. is σ41 (N/mm$^2$), and yield strength of the heat-radiation-side bonding-core members at 200° C. is σ42, a ratio (t1×A1×σ11+t3×A3×σ31)/(t2×A2×σ21+t4×A4×σ41) at 25° C. is 0.85 to 1.40 inclusive; and a ratio (t1×A1×σ12+t3×A3×σ32)/(t2×A2×σ22+t4×A4×σ42) at 200° C. is greater than 1.0 fold but no more than 1.4 fold as the ratio at 25° C.

Also in the above structure, it is possible to configure the symmetrical structure about the ceramic substrate even in the temperature change between 25° C. to 200° C., by setting the relation between the first layers and the heat sink into the above-described ratio of 0.85 to 1.40 inclusive at the room temperature 25° C. and the ratio at 200° C. when it is heated to be high as greater than 1.0 fold but not more than 1.4 fold as the ratio at 25° C. Accordingly, uneven stresses are not easy to be generated on both the surfaces of the ceramic substrate while heating or the like, and it is possible to prevent the generation of the warp.

In a case in which the ceramic substrate, having relatively small thermal-expansion coefficient and high rigidity, is configured from one sheet, it is possible to further prevent the uneven stresses on both the surfaces of the ceramic substrate while heating or the like, so that it is possible to further improve the effect of preventing the warp.

In the heat-sink-attached power-module substrate of the present invention, it is preferable that the second layers be formed from aluminum sheets having a larger yield strength at 200° C. than that of the heat sink.

In a case in which the second layers of the circuit layer and the heat sink are formed from a same kind of aluminum sheets, the warp amount while heating is easy to be changed by influence of the stress owing to the heat sink since the heat sink is configured from one sheet compared with the circuit layer separated into the plurality of small-circuit layers. Therefore, by using the aluminum sheet having the larger yield strength while heating, i.e., at 200° C., than that of the heat sink, the yield strength of the second layers acts so as to cancel increment of the stress by the heated heat sink; as a result, it is possible to further reduce the change amount of the warp.

In the heat-sink-attached power-module substrate according to the present invention, it is preferable that the second layers be formed from aluminum sheets having a purity lower than 99.90 mass %, and the heat sink be formed from an aluminum sheet having a purity of 99.90 mass % or lower.

In a case in which the second layers are formed from the aluminum sheets having the purity of less than 99.9 mass % and having the high yield strength, the thickness of the second layers can be thin, so that it can be more preferable structure without increasing the thermal resistance.

A power module of the present invention includes the heat-sink-attached power-module substrate and a semiconductor element mounted on a surface of at least one of the small-circuit layers.

Advantageous Effects of Invention

According to the present invention, it is possible to prevent deformation owing to temperature change in a mounting process of semiconductor elements or in usage environment, to improve reliability as an insulate substrate or connection reliability of semiconductor elements, and it is possible to show an excellent heat radiation property. It is possible to accurately position the plurality of small-circuit layers, and highly-integrate.

BRIEF DESCRIPTION OF DRAWINGS

FIG. 8 it is a sectional view of a heat-sink-attached power-module substrate according to a fifth embodiment of the present invention.

DESCRIPTION OF EMBODIMENTS

Below, embodiments of the present invention will be explained referring the drawings.

Figure 1:
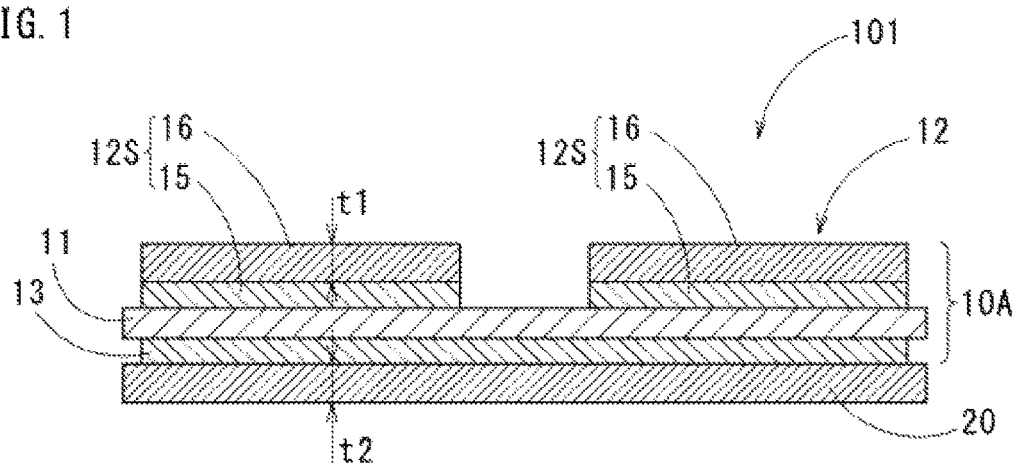
FIG. 1 It is a sectional view of a heat-sink-attached power-module substrate according to a first embodiment of the present invention.
Figure 2:
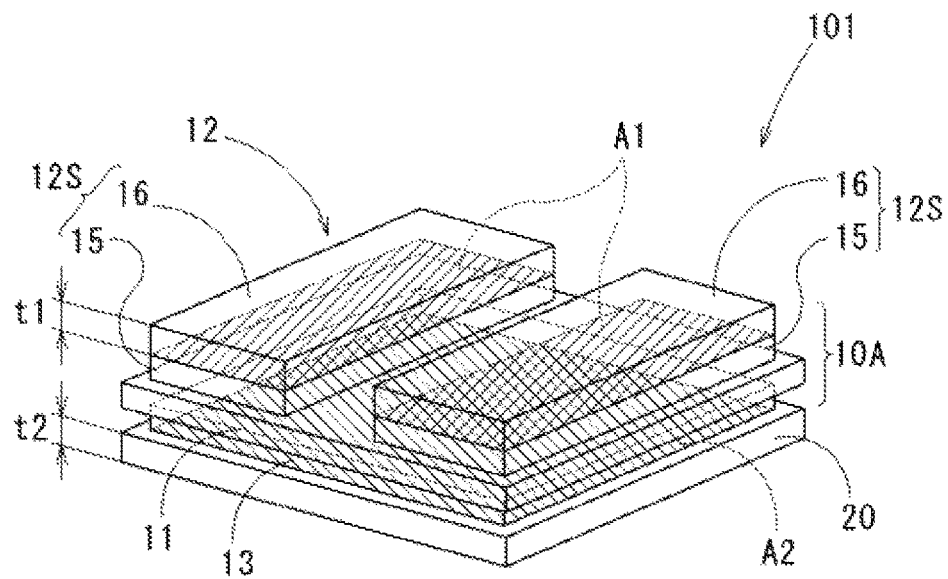
FIG. 2 It is a perspective view of the heat-sink-attached power-module substrate shown in FIG. 1.

A heat-sink-attached power-module substrate 101 of a first embodiment shown in FIG. 1 and FIG. 2 includes a power-module substrate 10A and a heat sink 20. Mounting semiconductor elements 30 such as semiconductor chips and the like on a surface of the heat-sink-attached power-module substrate 101 as shown in FIG. 3C, a power module 100 is manufactured.

The power-module substrate 10A is provided with one sheet of ceramic substrate 11, a circuit layer 12 formed from a plurality of small-circuit layers 12S bonded on one surface of the ceramic substrate 11 by brazing, and one sheet of metal layer 13 bonded on the other surface of the ceramic substrate 11 by brazing. The respective small-circuit layers 12S of the power-module substrate 10A are bonded on the one surface of the ceramic substrate 11 with spacing each other as shown in FIG. 1 and FIG. 2. The power-module substrate 10A is bonded on the heat sink 20 with a metal layer 13 therebetween. The metal layer 13 of the power-module substrate 10A and the heat sink 20 are bonded to each other by brazing; and the semiconductor elements 30 are bonded on surfaces of the respective small-circuit layers 12S by solder. The semiconductor elements 30 may be bonded on all of the small-circuit layers 12S; alternatively, there may be the small-circuit layers 12S on which the semiconductor elements 30 are not bonded.

For example, for the ceramic substrate 11, nitride-based ceramic such as AlN (aluminum nitride), $Si_3N_4$ (silicon nitride) and the like, or oxide-based ceramic such as $Al_2O_3$ (alumina) and the like can be used. A thickness of the ceramic substrate 11 may be set in a range of 0.2 to 1.5 mm.

Each of the small-circuit layers 12S forming the circuit layer 12 has a stacking structure formed from a first layer 15 bonded on the surface of the ceramic substrate 11 and a second layer 16 bonded on a surface of the first layer 15. For the first layers 15, aluminum sheets having a purity of 99.99 mass % or higher are used, i.e., 1N99 pure aluminum (a purity of 99.99 mass % or higher, so-called 4N aluminum) sheets in JIS (Japanese Industrial Standard).

The second layers 16 are made from aluminum sheets having a purity lower than that of the first layers 15, e.g., aluminum sheets having the purity lower than 99.90 mass %. According to JIS, pure aluminum sheets of so-called 2N aluminum (e.g., A1050 or the like) having a purity of 99.0 mass % or greater, or aluminum alloy sheets of A3003, A6063, A5052 or the like can be used. A thickness of the first layers 15 is set to be 0.1 mm to 2.5 mm inclusive. A thickness t1 of the second layers 16 is set to be 0.5 mm to 5.0 mm inclusive.

The metal layer 13 is, as in a case for the first layers 15 of the circuit layer 12, formed from an aluminum sheet having a purity of 99.99 mass % or greater, 1N99 in JIS (a purity 99.99 mass % or greater, so-called 4N aluminum) to have a thickness of 0.1 mm or more and less than 2.5 mm. The heat sink 20 which is bonded to the power-module substrate 10 is made of an aluminum sheet having a purity lower than that of the metal layer 13, for example, an aluminum sheet having a purity of 99.90 mass % or lower. That is, according to JIS, a pure aluminum sheet made of 1N90 (a purity 99.90 mass % or higher, so-called 3N aluminum), so-called 2N aluminum having a purity of 99.0 mass % or higher (e.g., A1050 or the like) or the like, or an aluminum-alloy sheet such as A3003, A6063, A5052 or the like can be used.

Appropriate shapes are acceptable for the heat sink; a flat-plate shape, one in which a plurality of pin-like fins are integrally formed by hot forging or the like, one in which parallel belt-like fins are integrally formed by extrusion molding, and the like. It is installed by screwing or the like to other members so as to be used as a part of a cooler in which coolant flows inside. Especially, it is preferable to use one having a flat-plate shape with a large effect of reducing a warp, or one in which a plurality of pin-like fins are integrally formed, as the heat sink. In this embodiment, the heat sink 20 having a flat-plate shape is used.

The heat sink 20 and the second layers 16 of the circuit layer 12 are controlled to have a relation below: when a thickness of the second layers 16 is t1 (mm), a sum total of joined-surface areas of the second layers 16 and the first layers 15 is A1 ($mm^2$), yield strength of the second layers 16 at 25° C. is σ11 ($N/mm^2$), and yield strength of the second layers 16 at 200° C. is σ12 ($N/mm^2$); and a thickness of the heat sink 20 is t2 (mm), a joined-surface area of the heat sink 20 and the metal layer 13 is A2 ($mm^2$), yield strength of the heat sink 20 at 25° C. is σ21 (N/mm²), and yield strength of the heat sink 20 at 200° C. is σ22 (N/mm²), a ratio (t1×A1×σ11)/(t2×A2×σ21) at 25° C. is 0.85 to 1.40 inclusive; and a ratio (t1×A1×σ12)/(t2×A2×σ22) at 200° C. is greater than 1.0 fold but no more than 1.4 fold as the ratio at 25° C.

In formulas of these ratios, the joined-surface area A1 (mm²) between the first layers 15 and the second layers 16 is a sum total of joined-surface areas between the first layers 15 and the second layers 16 in the respective small-circuit layers 12S forming the circuit layer 12.

For example, when: the second layers 16 are made of A6063 aluminum alloy having a thickness t1=1.2 mm (yield strength σ11=50 N/mm² at 25° C.; yield strength σ12=45 N/mm² at 200° C.); a joined-surface area A1 between the first layers 15 and the second layers 16 is 900 mm²; the heat sink 20 is made of A3003 aluminum alloy having a thickness t2=1.0 mm (yield strength σ21=40 N/mm² at 25° C.; yield strength σ22=30 N/mm² at 200° C.); and a joined-surface area A2 between the metal layer 13 and the heat sink 20 is 1000 mm², a ratio (t1×A1×σ11)/(t2×A2×σ21)=1.35 at 25° C. (room temperature); and a ratio (t1×A1×σ12)/(t2×A2×σ22)=1.62 at 200° C.

Next, a method of manufacturing the heat-sink-attached power-module substrate 101 formed as above will be explained. The heat-sink-attached power-module substrate 101 is manufactured by bonding the first layers 15 of the circuit layer 12 and the metal layer 13 to the ceramic substrate 11 (a first bonding process), and then bonding the second layers 16 on surfaces of the first layers 15 and bonding the heat sink 20 on a surface of the metal layer 13 (a second bonding process). Below, it will be explained in order of these processes.

(A First Bonding Process)

First, stacking first-layer aluminum sheets 15a to be the first layers 15 in the circuit layer 12 on one surface of the ceramic substrate 11 and stacking a metal-layer aluminum sheet 13a to be the metal layer on the other surface, then these are joined integrally. For bonding these members, brazing material 40 of alloy such as Al—Si based or the like is used. It is preferable to use the brazing material 40 in a foil shape.

Figure 3A:
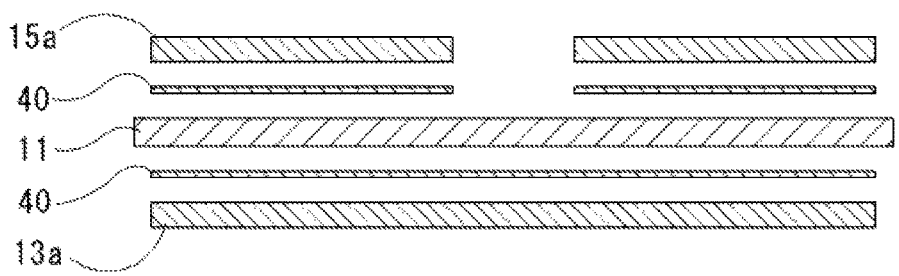
FIG. 3 It is a sectional view showing process of manufacturing the heat-sink-attached power-module substrate of the first embodiment shown in FIG. 1.
Figure 4:
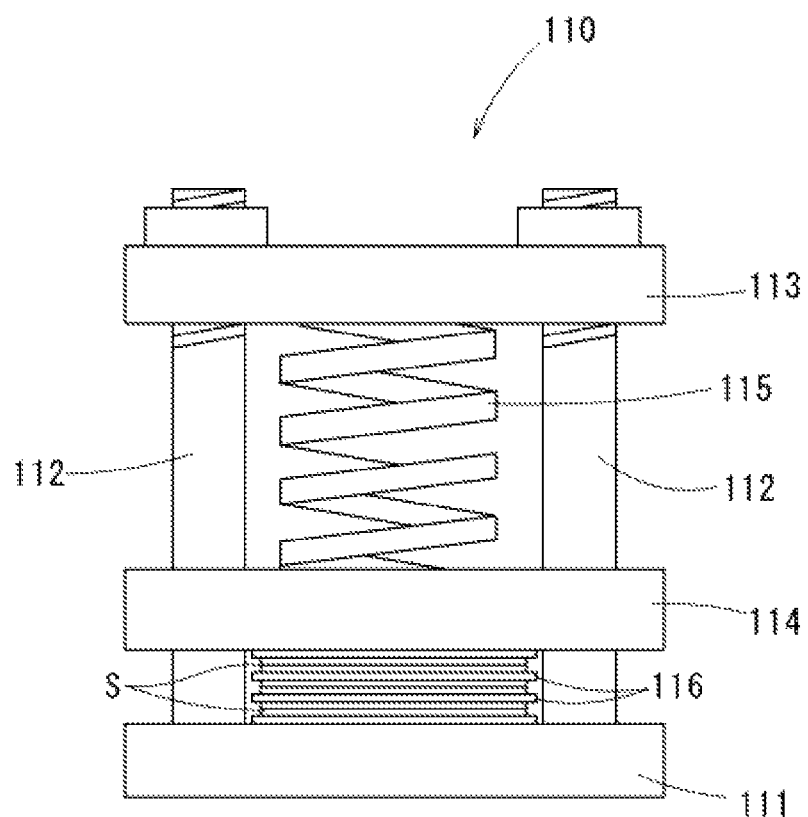
FIG. 4 It is a frontal view of a pressurizing device used for manufacturing the heat-sink-attached power-module substrate with the heat sink according to the first embodiment of the present invention.

These first-layer aluminum sheets 15a and the metal-layer aluminum sheet 13a are stacked on the ceramic substrate 11 with the brazing material 40 therebetween as shown in FIG. 3A. Stacked bodies S are pressurized in a stacking direction using a pressurizing device 110 shown in FIG. 4.

The pressurizing device 110 includes a base plate 111, guide posts 112 vertically fixed at four corners on an upper surface of the base plate 111, a fixed board 113 fixed on upper ends of the guide posts 112, a press board 114 supported by the guide posts 112 so as to move vertically between the base plate 111 and the fixed board 113, and a pushing device 115 such as a spring or the like, provided between the fixed board 113 and the press board 114, pushing the press board 114 downward.

The fixed board 113 and the press board 114 are arranged in parallel to the base plate 111, the above-described stacked bodies S are disposed between the base plate 111 and the press board 114. On two surfaces of the respective stacked bodies S carbon sheets 116 are arranged in order to press them uniform.

While pressing by the pressurizing device 110, the pressurizing device 110 is disposed in a heating furnace (not illustrated), so that brazing is performed by heating to brazing temperature under vacuum atmosphere. In this case, a pressurizing force is set to 0.68 MPa (7 kgf/cm²) for example, and a heating temperature is set to 640° C. for example.

(A Second Bonding Process)

Figure 3B:
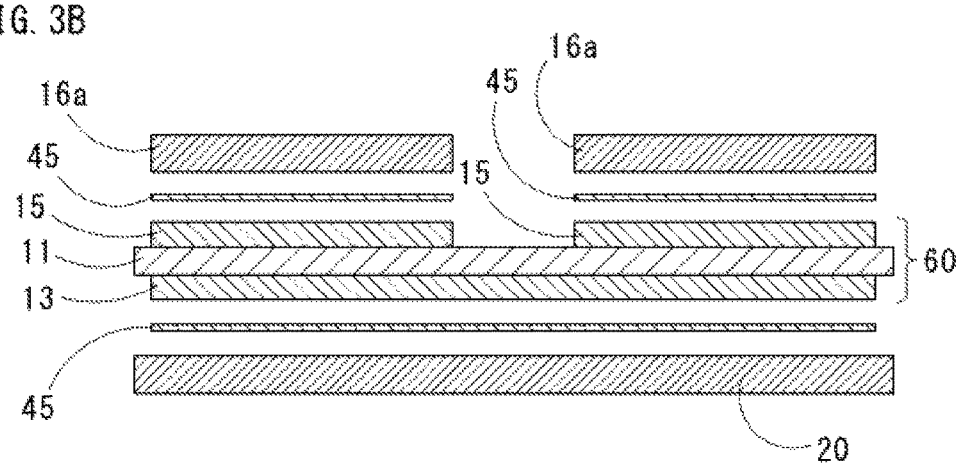
Figure 3C:
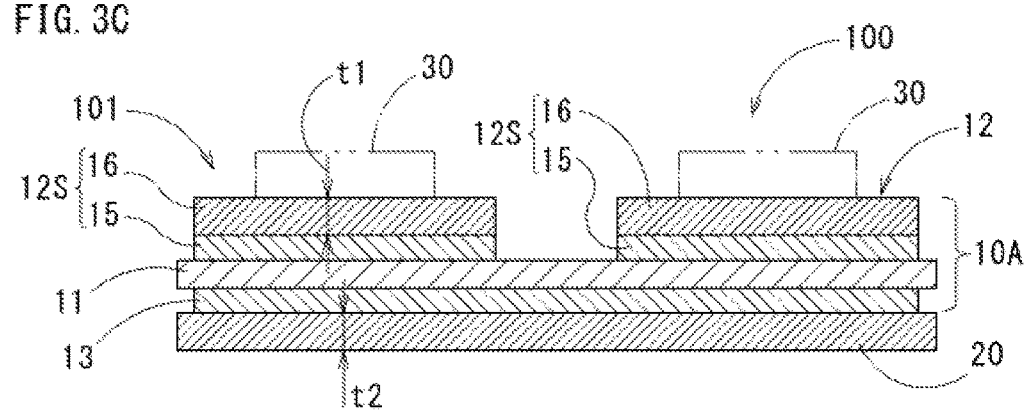

As shown in FIG. 3B, in a bonded body 60 obtained by the first bonding process, second-layer aluminum sheets 16a to be the second layers 16 are stacked on the first layers 15 with brazing materials 45 therebetween and the heat sink 20 is stacked on the metal layer 13 with the brazing material 45 therebetween. For the brazing materials 45, brazing material of Al—Si based alloy or the like is used in a foil shape. Stacked bodies of these members are pressed in the stacking direction by the pressurizing device 110 similar to one shown in FIG. 4, and heated in the vacuum atmosphere with the pressurizing device 110 so as to braze the second layers 16 and the heat sink 20 to the respective bonded bodies 60, and the heat-sink-attached power-module substrates 101 are manufactured. In this case, the pressurizing force is set to 0.68 MPa (7 kgf/cm²) for example, and the heating temperature is set to 615° C. for example.

As shown in FIG. 3C, the power module 100 is manufactured by bonding the semiconductor elements 30 by soldering on an upper surface of the circuit layer 12 (the second layers 16) of the heat-sink-attached power-module substrate 101 manufactured as above.

For soldering of the semiconductor elements 30, for example, Sn—Sb based, Sn—Ag based, Sn—Cu based, Sn—In based, or Sn—Ag—Cu based soldering material is used; and it is heated to 275° C. to 335° C.

In the above-described first embodiment, the brazing process is performed in the vacuum atmosphere using Al—Si based alloy as the brazing material: however, it is possible to use Al—Si—Mg based alloy, Al—Mg based alloy, Al—Ge based alloy, Al—Cu based alloy, Al—Mn based alloy or the like for the brazing material. When using the brazing material including Mg, such as Al—Si—Mg based alloy, Al—Mg based alloy or the like, it is possible to braze in non-oxidizing atmosphere.

In the power module 100 manufactured as above, the heat-sink-attached power-module substrate 101 has the circuit layer 12 formed from the plurality of small-circuit layers 12S each having the stacked structure of the first layer 15 and the second layer 16 as described above, so that the second layers 16 formed from the aluminum sheets having high purity of aluminum and high rigidity are disposed on the counter side of the ceramic substrate 11 with respect to the heat sink 20 having the lower aluminum purity and high rigidity, i.e., high yield strength. Therefore, it is a symmetrical structure of the heat sink 20 and the second layers 16 about the ceramic substrate 11 therebetween, so that the stress on the two surface of the ceramic substrate 11 would not uneven when heating or the like, the warp of the heat-sink-attached power-module substrate 101 would be reduced. Since the first layers 15 and the metal layer 13 bonded on the ceramic substrate 11 are formed from the aluminum sheets having the purity of 99.99 mass % or greater, the aluminum sheets are relatively soft, i.e., have the low yield strength, it is possible to prevent the breakage of the ceramic substrate 11 when it is heated or the like by reducing the thermal stress on the ceramic substrate 11.

In the heat-sink-attached power-module substrate 101, since the circuit layer 12 is formed from the plurality of small-circuit layers 12S so that the circuit layer 12 has a structure which is separated into multi-parts, form of a joint part of the circuit layer 12 bonded on the ceramic substrate 11 is different from form of a joint part the heat sink 20 bonded on the ceramic substrate 11: bend stress on the ceramic substrate 11 by the heat sink 20 formed in one sheet is larger than that by the circuit layer 12 formed from the plurality of small-circuit layers 12S. Accordingly, in the heat-sink-attached power-module substrate 101, in order to reduce the change of the warp amount of the heat-sink-attached power-module substrate 101 along with the temperature change, the warp is reduced by controlling the relation between the second layers 16 of the circuit layer 12 and the heat sink 20 at the room temperature 25° C. into the above described range of the ratio at 25° C., and the bend stress at the circuit layer 12 side is larger at 200° C. than that at 25° C. when the heat-sink-attached power-module substrate 101 is heated by controlling the ratio at 200° C. to be greater than 1.0 fold but no more than 1.4 fold as the ratio at 25° C.

With respect to the second layers 16 and the heat sink 20, a relation between thicknesses, joined-surface areas and yield strength of these members is controlled to a relation having a ratio $(t1 \times A1 \times \sigma 11)/(t2 \times A2 \times \sigma 21)$ at 25° C. being 0.85 to 1.40 inclusive and a ratio $(t1 \times A1 \times \sigma 12)/(t2 \times A2 \times \sigma 22)$ at 200° C. being greater than 1.0 fold but no more than 1.4 fold as the ratio at 25° C. By controlling the relation into the above ratios at the room temperature 25° C. and the heated temperature 200° C., it is possible to reduce the change amount of the warp at the heat-sink-attached power-module substrate 101 within the temperature range 25° C. to 200° C., so that it is possible to stably maintain the symmetry about the ceramic substrate 11. As described above, in the heat-sink-attached power-module substrate 101 of the present embodiment, it is possible to have the good symmetrical structure about the ceramic substrate 11 when the ratio $(t1 \times A1 \times \sigma 11)/(t2 \times A2 \times \sigma 21)$ at 25° C. is 1.00, no less than 0.85 but less than 1.00, or greater than 1.00 but no more than 1.4; and when the ratio $(t1 \times A \times \sigma 2)/(t2 \times A2 \times \sigma 22)$ at 200° C. is greater than 1.0 fold but no more than 1.4 fold as the ratio at 25° C. As a result, it is possible to reduce the change of the warp amount in the temperature range between 25° C. and 200° C., and it is possible to stably maintain the symmetry about the ceramic substrate 11 even when heating. Accordingly, uneven stress on the two surface of the ceramic substrate 11 would be reduced while heating or the like, and it is possible to reliably prevent the warp.

As in the present embodiment, in a case in which the circuit layer 12 is patterned from the plurality of small-circuit layers 12S which are separated from each other, such a case in which the plurality of small-circuit layers 12S are arranged on the ceramic substrate 11 of the heat-sink-attached power-module substrate 101, it is possible to reliably prevent the warp by considering the symmetry between the rigidity of the second layers 16 (the yield strength considering a volume multiplied the thickness t1 by the joined-surface area A1) and the rigidity of the heat sink 20 (the yield strength considering a volume multiplied the thickness t2 by the joined-surface area A2) at the joint part of the circuit layer 12 to the ceramic substrate 11 and the joint part of the heat sink 20 to the ceramic substrate 11.

Considering the symmetry between the rigidity of the second layers 16 and the rigidity of the heat sink 20 at both the room temperature 25° C. and the heated temperature 200° C. and controlling the ratio at the 200° C. to be greater than the ratio at 25° C., it is possible to reduce the change amount of the warp along with the temperature change from 25° C. to 200° C., and it is possible to reduce the initial warp after bonding the heat sink 20, and furthermore reducing the warp in the mounting process of the semiconductor elements 30 or in the usage environment. Accordingly, the heat-sink-attached power-module substrate 101 has high reliability as an insulate substrate for a long term and shows a good heat radiation property.

In the heat-sink-attached power-module substrate 101, the second layers 16 are formed from A6063 aluminum alloy and the heat sink 20 is formed from A3003 aluminum alloy: the aluminum sheets having the higher yield strength than that of the heat sink 20 at 200° C. are used for the second layers 16. As described above, using the aluminum sheets having the larger yield strength when it is heated than that of the heat sink 20 as the second layers 16 of the circuit layer 12, the yield strength of the second layers 12 acts so as to cancel increment of the stress by the heated heat sink 20, so that the deformation amount of the warp can be more reduced. Moreover, the aluminum sheets having the high rigidity, i.e., the high yield strength, are used for the second layers 16 on which the semiconductor elements 30 are soldered, so that the deformation of the circuit layer 12 can be also reduced. In the heat-sink-attached power-module substrate 101, the plurality of small-circuit layers 12S are bonded on the one sheet of heat sink 20, so that it is possible to accurately position the plurality of small-circuit layers 12S and highly-integrate.

FIG. 5 shows process of manufacturing a heat-sink-attached power-module substrate 102 of a second embodiment. In this second embodiment, the same parts as in the first embodiment shown in FIG. 1 to FIG. 3 are denoted by the same reference symbols. It is the same as also in embodiments described below.

This heat-sink-attached power-module substrate 102 is formed, as in the first embodiment, by bonding a circuit layer 17 formed from a plurality of small-circuit layers 17S on one surface of the ceramic substrate 11 and bonding the one sheet of heat sink 20 on the other surface of the ceramic substrate 11 with interposing the one sheet of metal layer 13 therebetween: furthermore, bonding the first layers 15 and the second layers 16 of the circuit layer 17 in a power-module substrate 10B by double-side clad brazing members 43a in which brazing layers 42 are formed on two surfaces of a circuit-side bonding-core member 41a. As in the first embodiment, the metal layer 13 and the heat sink 20 are bonded by brazing material 45 made of Al—Si base alloy or the like.

In the double-side clad brazing members 43a, the circuit-side bonding-core members 41a are made from A3003 aluminum alloy by JIS having a thickness of 0.05 mm to 0.6 mm; and the brazing layers 42a on the two surfaces are made of Al—Si—Mg based alloy.

Figure 5A:
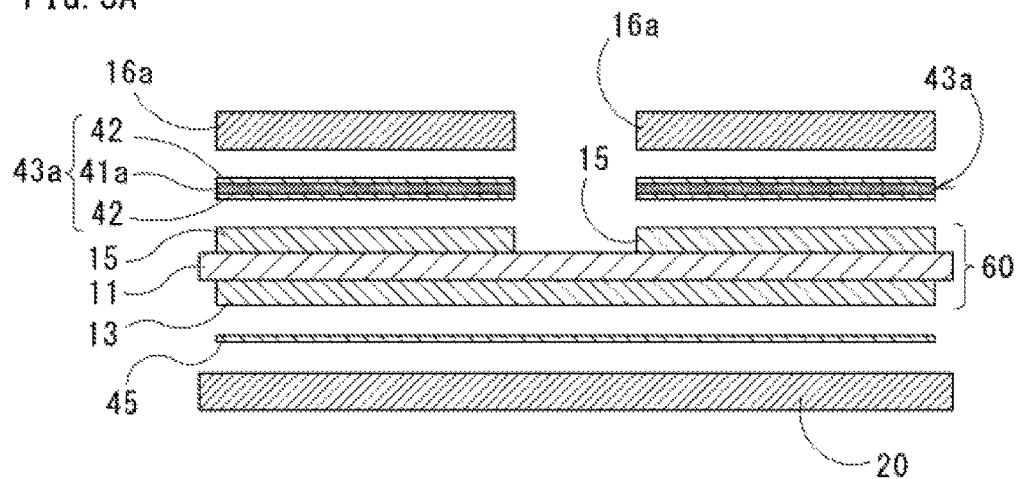
FIG. 5 It is a sectional view showing process of manufacturing a heat-sink-attached power-module substrate with a heat sink according to a second embodiment of the present invention.

As in the first bonding process of the first embodiment, in the heat-sink-attached power-module substrate 102 of the second embodiment, bonding the first layers 15 on the one surface of the ceramic substrate 11 and bonding the metal layer 13 on the other surface of the ceramic substrate 11 by brazing using the brazing materials 40 (refer to FIG. 3A) so as to form the bonded body 60. Then, as shown in FIG. 5A, stacking the second layers 16 on the surfaces of the first layers 15 with the double-side clad brazing members 43a therebetween and stacking the heat sink 20 on the metal layer 13 with the brazing material 45 therebetween, pressurizing them in the stacking direction and heating in the non-oxidizing atmosphere such as nitrogen atmosphere or the like so as to braze them, the heat-sink-attached power-module substrate 102 is manufactured.

Figure 5B:
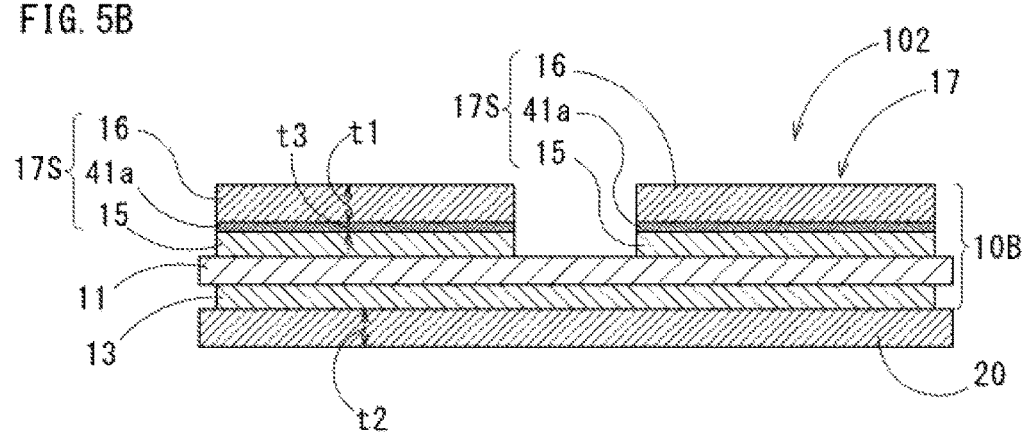

In this heat-sink-attached power-module substrate 102, as shown in FIG. 5B, thin aluminum alloy layers which were the circuit-side bonding-core members 41a of the double-side clad brazing members 43a are interposed between the first layers 15 and the second layers 16 of the circuit layer 17.

In the heat-sink-attached power-module substrate 102 of the second embodiment, when the thickness of the second layers 16 is t1 (mm), the joined-surface area of the second layers 16 to the circuit-side bonding-core members 41a is A1 (mm$^2$), the yield strength of the second layers 16 at 25° C. is σ11 (N/mm$^2$), the yield strength of the second layers 16 at 200° C. is σ12 (N/mm$^2$) in the circuit layer 17; the thickness of the heat sink 20 is t2 (mm), the joined-surface are of the heat sink 20 to the metal layer 13 is A2 (mm$^2$), the yield strength of the heat sink 20 at 25° C. is σ21 (N/mm$^2$), the yield strength of the heat sink 20 at 200° C. is σ22 (N/mm$^2$); a thickness of the circuit-side bonding-core members 41a is t3 (mm), a joined-surface are of the circuit-side bonding-core members 41a to the first layers 15 is A3 (mm$^2$), yield strength of the circuit-side bonding-core members 41a at 25° C. is σ31 (N/mm$^2$), yield strength of the circuit-side bonding-core members 41a at 200° C. is σ32 (N/mm$^2$): a relation between the thicknesses, the joined-surface areas and the yield strength of the second layers 16, the circuit-side bonding-core members 41a and the heat sink 20 are controlled so that a ratio (t1×A1×σ11+t3×A3×σ31)/(t2×A2×σ21) at 25° C. is 0.85 to 1.40 inclusive, and a ratio (t1×A1×σ12+t3×A3×σ32)/(t2×A2×σ22) at 200° C. is greater than 1.0 fold to 1.4 fold or less as the ratio at 25° C.

As described above, in the heat-sink-attached power-module substrate 102, the ratio at 25° C. and the ratio at 200° C. are controlled in the above ranges: thereby enabling to reduce a change amount of a warp of the heat-sink-attached power-module substrate 102 in a temperature range of 25° C. to 200° C. and to stably maintain a symmetry about the ceramic substrate 11. That is to say, when the ratio (t1×A1×σ11+t3×A3×σ31)/(t2×A2×σ21) at 25° C. is 1.0, greater than 0.85 and less than 1.00, or greater than 1.00 but no more than 1.40 and moreover the ratio (t1×A1×σ12+t3×A3×σ32)/(t2×A2×σ22) at 200° C. is greater than 1.0 fold but no more than 1.4 fold as the ratio at 25° C., the symmetrical structure about the ceramic substrate 11 can be desirably formed.

FIG. 6 shows process of manufacturing a heat-sink-attached power-module substrate 103 of a third embodiment. In this third embodiment, the same parts as in the first embodiment and the second embodiment are denoted by the same reference symbols.

Figure 6A:
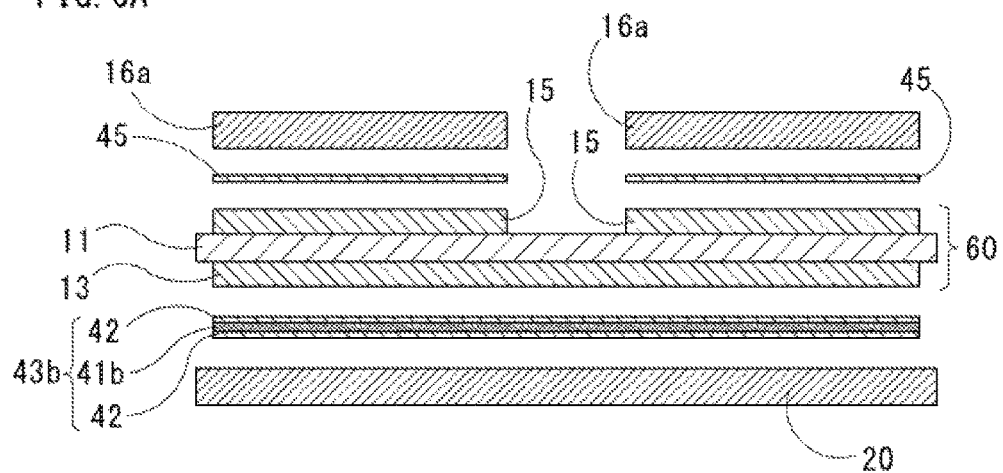
FIG. 6 It is a sectional view showing process of manufacturing a heat-sink-attached power-module substrate according to a third embodiment of the present invention.
Figure 6B:
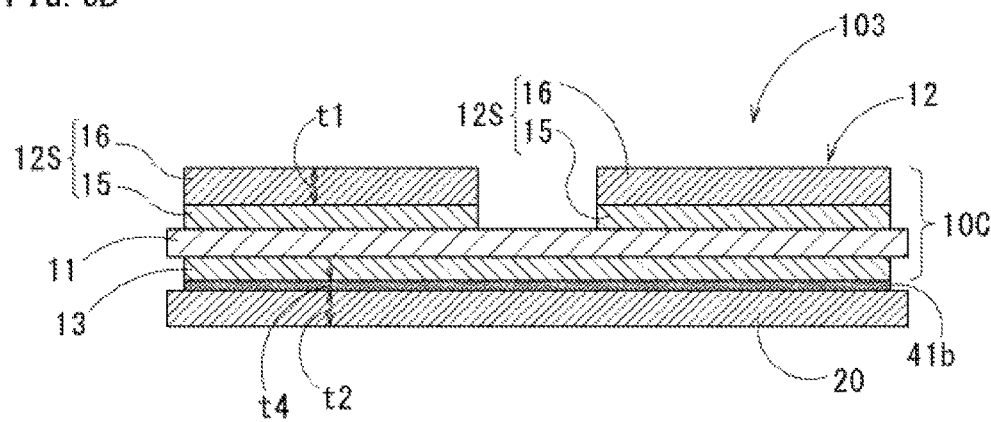

As shown in FIG. 6B, bonding the circuit layer 12 formed from the plurality of small-circuit layer 12S on the one surface of the one sheet of ceramic substrate 11, bonding the one sheet of metal layer 13 on the other surface of the ceramic substrate 11, and bonding the one sheet of heat sink 20 on the metal layer with interposing one sheet of heat-radiation-side bonding-core member 41b, the heat-sink-attached power-module substrate 103 is formed. In a power-module substrate 10C, the first layers 15 and the second layer 16 of the circuit layer 12 are, as in the first embodiment, bonded by the brazing materials 45 made of Al—Si based alloy or the like. The metal layer 13 and the heat sink 20 are bonded by a double-side clad brazing member 43b having the brazing layers 42 formed on two surfaces of the heat-radiation-side bonding-core member 41b. In the double-side clad brazing member 43b, the heat-radiation-side bonding-core member 41a is made of A3003 aluminum alloy by JIS having a thickness of 0.05 mm to 0.6 mm, and the brazing layers 42 formed on both the surfaces are made of Al—Si—Mg based alloy.

The heat-sink-attached power-module substrate 103 of the third embodiment is, as in the first bonding process of the first embodiment, manufactured by: forming the bonded body 60 by bonding the first layers 15 on the one surface of the ceramic substrate 11 and bonding the metal layer 13 on the other surface of the ceramic substrate 11 by brazing using the brazing material 40 (refer to FIG. 3A); then as shown in FIG. 6A, stacking the second layers 16 on the surface of the first layers 15 with interposing the brazing material 45; stacking the heat sink 20 on the metal layer 13 with interposing the double-side clad brazing member 43b; and pressurizing them in the stacking direction and heating them in the non-oxidizing atmosphere such as the nitrogen atmosphere so as to braze.

The heat-sink-attached power-module substrate 103 of the third embodiment manufactured as above has a state in which a thin aluminum alloy layer that was the heat-radiation-side bonding-core member 41b is interposed between the metal layer 13 and the heat sink 20 as shown in FIG. 6B.

In the heat-sink-attached power-module substrate 103 of the third embodiment, when: the thickness of the second layers 16 in the circuit layer 12 is t1 (mm), the joined-surface area of the second layers 16 is A1 (mm$^2$), the yield strength at 25° C. of the second layers 16 is σ11 (N/mm$^2$), and the yield strength at 200° C. of the second layers 16 is σ12; the thickness of the heat sink 20 is t2 (mm), the joined-surface area of the heat sink 20 is A2 (mm$^2$), the yield strength at 25° C. of the heat sink 20 is σ21 (N/mm$^2$), and the yield strength at 200° C. of the heat sink 20 is σ22 (N/mm$^2$); a thickness of the heat-radiation-side bonding-core member 41b is t4 (mm), a joined-surface area of heat-radiation-side bonding-core member 41b to the metal layer 13 is A4 (mm$^2$), yield strength at 25° C. of the heat-radiation-side bonding-core member 41b is σ41 (N/mm$^2$), and yield strength at 200° C. of the heat-radiation-side bonding-core member 41b is σ42 (N/mm$^2$); a relation of the thicknesses, the joined-surface areas, and the yield strength of the second layers 16, the heat sink 20 and the heat-radiation-side bonding-core member 41b is controlled as follows: a ratio (t1×A1×σ11)/(t2×A2×σ21+t4×A4×σ41) at 25° C. is 0.85 to 1.40 inclusive; and a ratio (t1×A1×σ12)/(t2×A2×σ22+t4×A4×σ42) at 200° C. is greater than 1.0 fold but no more than 1.4 fold as the ratio at 25° C.

Also in the heat-sink-attached power-module substrate 103, as in the first embodiment and the second embodiment, the ratio at 25° C. and the ratio at 200° C. are controlled in the above range, it is possible to reduce the change of the warp amount of the heat-sink-attached power-module substrate in the temperature range of 25° C. to 200° C. and to stably maintain the symmetry about the ceramic substrate 11. That is to say, when the ratio (t1×A1×σ11)/(t2×A2×σ21+t4×A4×σ41) at 25° C. is 1.00, 0.85 or greater and less than 1.0, and greater than 1.00 but no more than 1.40, and the ratio (t1×A1×σ12)/(t2×A2×σ22+t4×A4×σ42) at 200° C. is greater than 1.0 fold but no more than 1.4 fold as the ratio at 25° C., it is possible to form the symmetric structure about the ceramic substrate 11 appropriately.

Figure 7A:
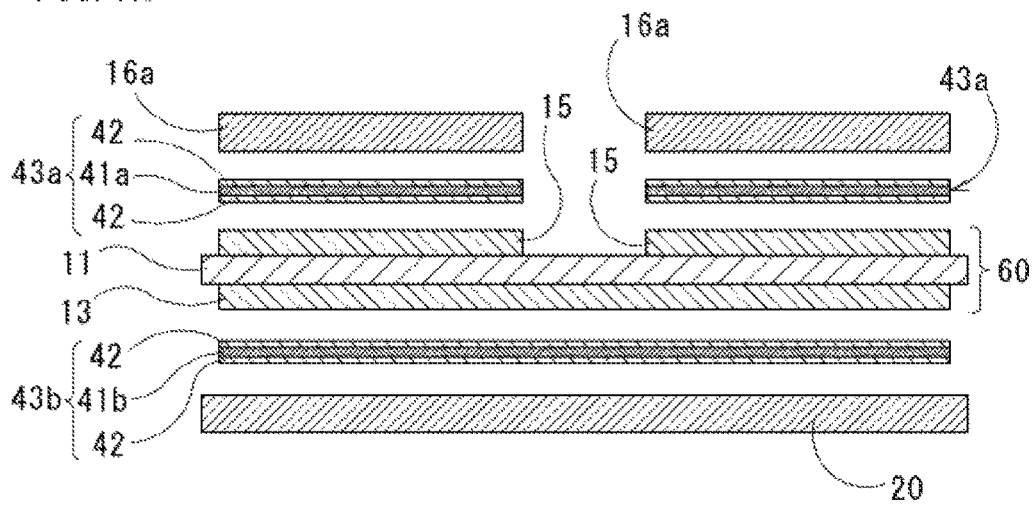
FIG. 7 It is a sectional view showing process of manufacturing a heat-sink-attached power-module substrate according to a fourth embodiment of the present invention.
Figure 7B:
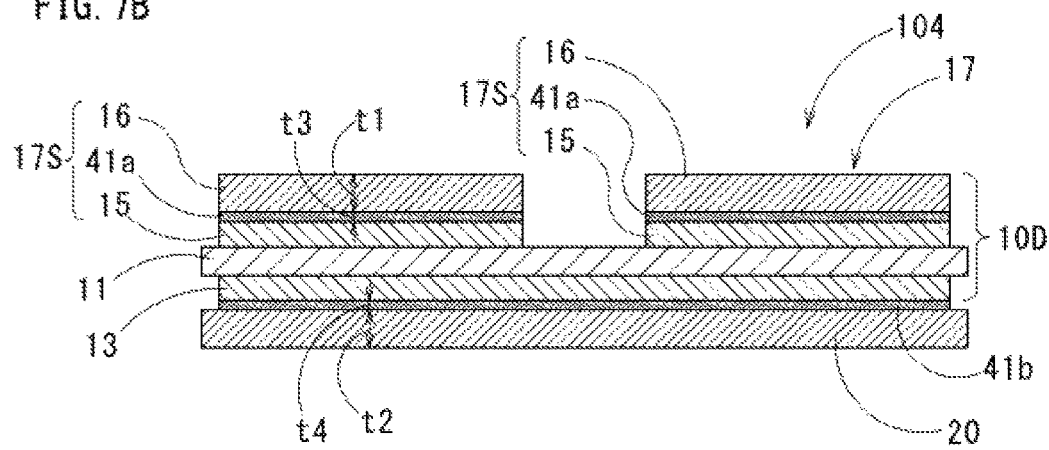

FIG. 7 shows process of manufacturing a heat-sink-attached power-module substrate 104 of a fourth embodiment. In this fourth embodiment, the same parts as in the first to the third embodiments are denoted by the same reference symbols. The heat-sink-attached power-module substrate 104 is formed by, as shown in FIG. 7B, bonding the circuit layer 17 formed from the plurality of small-circuit layers 17S on the one surface of the one sheet of ceramic substrate 11, bonding the one sheet of metal layer 13 on the other surface of the ceramic substrate 11, and bonding the one sheet of heat sink 20 on the metal layer 13 with interposing the one sheet of heat-radiation-side bonding-core member 41b. The first layers 15 and the second layers 16 of the circuit layer 17 in a power-module substrate 10D are bonded by the double-side clad brazing members 43a in which the brazing layers 42 are formed on the two surfaces of the circuit-side bonding-core members 41a.

The double-side clad brazing members 43a and 43b have the circuit-side bonding core member 41a and the heat-radiation-side bonding-core member 41b made of A3003 aluminum alloy by JIS with the thickness of 0.05 mm to 0.6 mm and the brazing layers 42 on both the surfaces made of Al—Si—Mg based alloy.

The heat-sink-attached power-module substrate 104 of this fourth embodiment is, as in the first bonding process of the first embodiment, manufactured by forming the bonded body 60 by bonding the first layers 15 and the metal layer 13 on the other surface by brazing using the brazing material 40 (refer to FIG. 3A), then as shown in FIG. 7A, stacking the second layers 16 on the surfaces of the first layers 15 with the double-side clad brazing members 43a therebetween and the heat sink 20 on the metal layer 13 with the double-side clad brazing member 43b therebetween, pressurizing them in the stacking direction, and brazing them in the non-oxidizing atmosphere such as nitrogen atmosphere by heating.

The heat-sink-attached power-module substrate 104 of the forth embodiment manufactured as above has a state in which thin aluminum alloy layers which were the circuit-side bonding-core members 41a are interposed between the first layers 15 and the second layers 16 and a thin aluminum alloy layer which was the heat-radiation-side bonding-core member 41b is interposed between the metal layer 13 and the heat sink 20, as shown in FIG. 7B.

In the heat-sink-attached power-module substrate 104 of the fourth embodiment, when the thickness of the second layers 16 is t1 (mm), the joined-surface area of the second layers 16 is A1 (mm$^2$), the yield strength at 25° C. of the second layers 16 is σ11 (N/mm$^2$), and the yield strength at 200° C. of the second layers 16 is σ12 (N/mm$^2$); the thickness of the heat sink 20 is t2 (mm), the joined-surface area of the heat sink 20 is A2 (mm$^2$), the yield strength at 25° C. of the heat sink 20 is σ21 (N/mm$^2$), and the yield strength at 200° C. of the heat sink 20 is σ22 (N/mm$^2$); the thickness of the circuit-side bonding-core members 41a is t3 (mm), the joined-surface area of the circuit-side bonding-core members 41a to the first layers 15 is A3 (mm$^2$), the yield strength at 25° C. of the circuit-side bonding-core members 41a is σ31 (N/mm$^2$), and the yield strength at 200° C. of the circuit-side bonding-core members 41a is σ32 (N/mm$^2$); and the thickness of the heat-radiation side bonding-core member 41b is t4 (mm), the joined-surface area of the heat-radiation side bonding-core member 41b to the metal layer 13 is A4 (mm$^2$), the yield strength at 25° C. of the heat-radiation side bonding-core member 41b is σ41 (N/mm$^2$), and the yield strength at 200° C. of the heat-radiation side bonding-core member 41b is σ42 (N/mm$^2$), the second layers 16 and the circuit-side bonding-core members 41a, and the heat sink 20 and the heat-radiation-side bonding-core member 41b are controlled to have a relation in the thicknesses, the joined-surface areas and the yield strength below: a ratio $(t1 \times A1 \times \sigma11 + t3 \times A3 \times \sigma31)/(t2 \times A2 \times \sigma21 + t4 \times A4 \times \sigma41)$ at 25° C. is 0.85 to 1.40 inclusive; and a ratio $(t1 \times A1 \times \sigma12 + t3 \times A3 \times \sigma32)/(t2 \times A2 \times \sigma22 + t4 \times A4 \times \sigma42)$ at 200° C. is greater than 1.0 fold but no more than 1.4 fold as the ratio at 25° C.

Accordingly, also in the heat-sink-attached power-module substrate 104, as in the first to the third embodiments, by controlling the ratio at 25° C. and the ratio at 200° C. into the above range, it is possible to reduce the change of the warp amount of the heat-sink-attached power-module substrate 104 in the temperature range of 25° C. to 200° C., so that the symmetry about the ceramic substrate 11 can be stably maintained. That is to say, it is possible to form the symmetric structure about the ceramic substrate 11 appropriately when the ratio $(t1 \times A1 \times \sigma11 + t3 \times A3 \times \sigma31)/(t2 \times A2 \times \sigma21 + t4 \times A4 \times \sigma41)$ at 25° C. is 1.00, 0.85 or greater and less than 1.00, and greater than 1.00 but no more than 1.40, and furthermore the ratio $(t1 \times A1 \times \sigma12 + t3 \times A3 \times \sigma32)/(t2 \times A2 \times \sigma22 + t4 \times A4 \times \sigma42)$ at 200° C. is greater than 1.0 fold but no more than 1.4 fold as the ratio at 25° C.

FIG. 8 shows a heat-sink-attached power-module substrate 105 of a fifth embodiment. FIG. 9 shows process of manufacturing this heat-sink-attached power-module substrate 105. In the fifth embodiment, the same parts as in the first to fourth embodiments are denoted by the same reference symbols.

In the heat-sink-attached power-module substrate 105, a plurality of power-module substrates 10E are bonded on the one sheet of heat sink 20 with spacing each other, so that the plurality of small-circuit layers 12S are provided and form the circuit layer 12. Specifically, the ceramic substrate 11 is formed from a same number of small-ceramic substrate 11S as that of the small-circuit layers 12S, and also the metal layer 13 is formed from a same number of small-metal layers 13S as that of the small-circuit layers 12S. Each of the power-module substrates 10E is formed by bonding the small-circuit layer 12S and the small-metal layer 13S with interposing the small-ceramic substrate 11S.

Each of the small-circuit layers 12S has a stacking structure including the first layer 15 bonded on the small-ceramic substrate 11S and the second layer 16 bonded on the surface of the first layer 15. The first layer 15 and the second layer 16 are bonded by the brazing material 45 made of AlSi based alloy or the like as in the first embodiment. Also, the small-metal layers 13S and the heat sink 20 are bonded by the brazing material 45 made of Al—Si based alloy or the like as in the first embodiment.

Figure 9A:
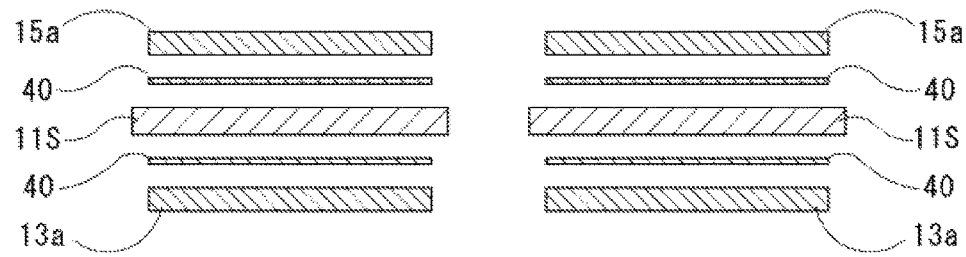
FIG. 9 It is a sectional view showing process of manufacturing the heat-sink-attached power-module substrate of the fifth embodiment shown in FIG. 8.
Figure 9B:
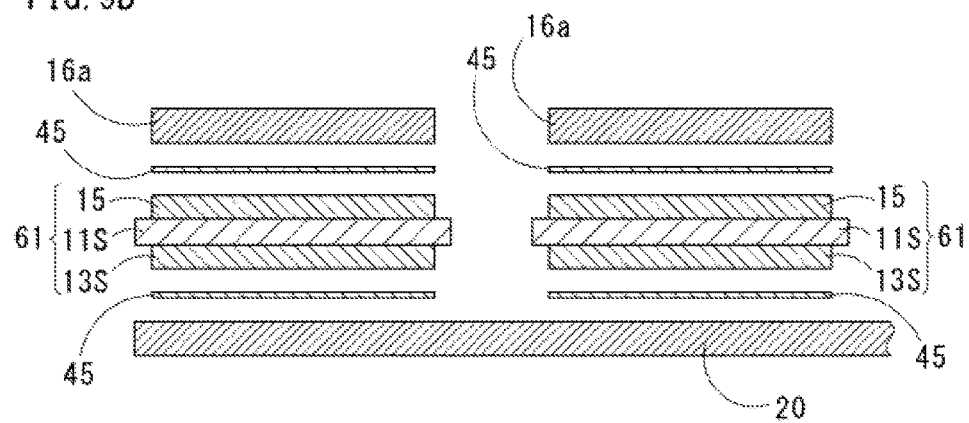
Figure 9C:
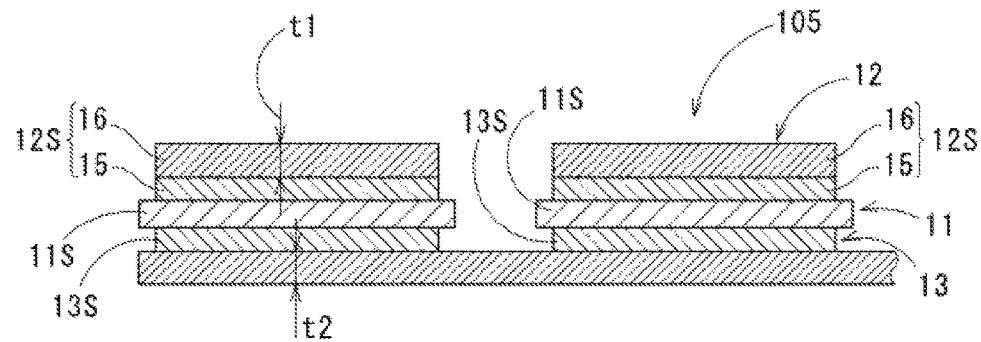

In the heat-sink-attached power-module substrate 105 of the fifth embodiment, at first, as shown in FIG. 9A, as in the first bonding process of the first embodiment, with respect to each of the small-ceramic substrates 11S, an first-layer aluminum sheet 15a to be the first layer 15 is stacked on one surface, and a metal-layer aluminum sheet 13a to be the small-metal layer 13S is stacked on the other surface with interposing the brazing material 40 made of Al—Si based alloy or the like respectively, and then these are integrally bonded by brazing. After forming bonded bodies 61, as shown in FIG. 9B, the second layers 16 are stacked on the surfaces of the first layers 15 with interposing the brazing materials 45 and the small-metal layers 13S are stacked on the heat sink 20 with interposing the brazing material 45. Then, these are pressurized in the stacking direction and heated in non-oxidizing atmosphere such as nitrogen atmosphere or the like to braze, so that a heat-sink-attached power-module substrate is manufactured.

Figure 10A:
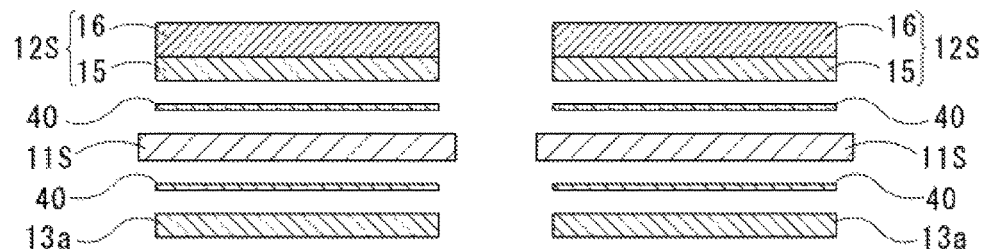
FIG. 10 It is a sectional view showing another process of manufacturing the heat-sink-attached power-module substrate of the fifth embodiment shown in FIG. 8.

For the small-circuit layers 12S in the heat-sink-attached power-module substrate 105 of the fifth embodiment, as shown in FIG. 10A, clad material made from the first layer 15 and the second layer 16 of the small-circuit layer 12S can be used.

Figure 10B:
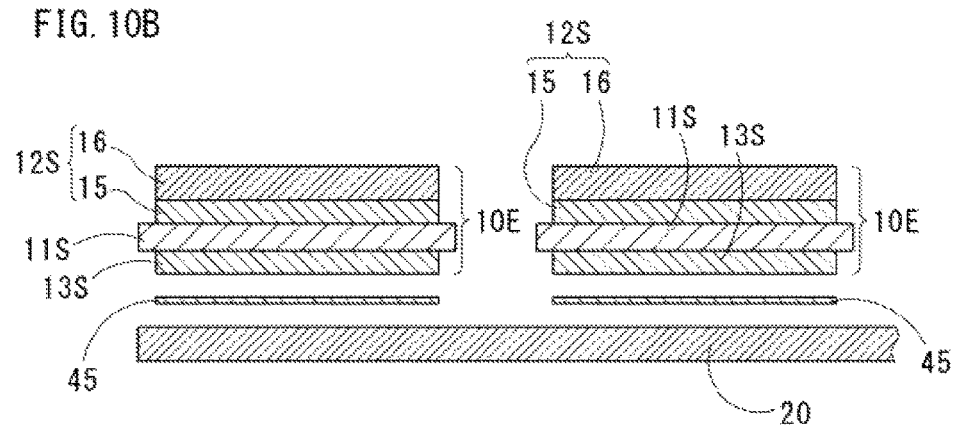
Figure 10C:
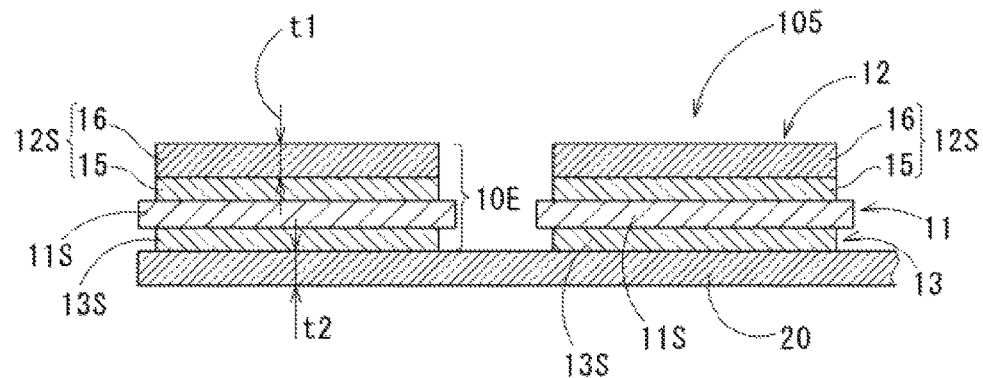

In this case, as shown in FIG. 10A, the small-circuit layer 12S of clad material is stacked on the one surface of the small-ceramic substrate 115 with the brazing material 40 made of Al—Si based alloy therebetween, and the metal-layer aluminum sheet 13a to be the small-metal layer 13S is stacked on the other surface of the small-ceramic substrate 11S with the brazing material made of Al—Si based alloy therebetween: these are pressurized in vacuum atmosphere and brazed (the first bonding process). As a result, as shown in FIG. 10B, the small-circuit layer 12S and the small-metal layer 13S are bonded on the surfaces of the small-ceramic substrate 11S, so that the power-module substrate 10E is manufactured. Next, as shown in FIG. 10B, the heat sink 20 is stacked on the small-metal layers 13S of the power-module substrates 10E with interposing the brazing material 45 made of Al—Si—Mg based alloy, and these are pressurized under non-oxidizing atmosphere such as nitrogen atmosphere or the like and heated, so that the heat-sink-attached power-module substrate 105 is manufactured.

In these heat-sink-attached power-module substrates 105 of the fifth embodiment, when the thickness of the second layers 16 is t1 (mm), the joined-surface area of the second layers 16 to the first layers 15 is A1 (mm$^2$), the yield strength at 25° C. of the second layers 16 is σ11 (N/mm$^2$), and the yield strength at 200° C. of the second layers 16 is σ12 (N/mm$^2$); and the thickness of the heat sink 20 is t2 (mm), the joined-surface area of the heat sink 20 to the metal layer 13 is A2 (mm$^2$), the yield strength at 25° C. of the heat sink 20 is σ21 (N/mm$^2$), and the yield strength at 200° C. of heat sink 20 is σ22 (N/mm$^2$), the second layers 16 and the heat sink 20 are controlled in the thicknesses, the joined-surface areas and the yield strength to have a relation below: a ratio (t1×A1×σ11)/(t2×A2×σ21) at 25° C. is 0.85 to 1.40 inclusive; and a ratio (t1×A1×σ12)/(t2×A2×σ22) at 200° C. is greater than 1.0 fold but no more than 1.4 fold as the ratio at 25° C.

In these formulas of ratio, the joined-surface area A1 (mm$^2$) of the second layers 16 to the first layers 15 is a sum total of the respective joined-surface areas of the second layers 16 to the first layers 15 in the small-circuit layers 12S forming the circuit layer 12: the joined-surface area A2 (mm$^2$) of the metal layer 13 and the heat sink 20 is a sum total of the respective joined-surface areas of the heat sink 20 and the small-metal layers 13 forming the metal layer 13.

Also in the heat-sink-attached power-module substrate 105, as in the first to fourth embodiments, by controlling the ratio at 25° C. and the ratio at 200° C. into the above range, it is possible to reduce the change of the warp amount of the heat-sink-attached power-module substrate 105 in the temperature range 25° C. to 200° C., so that the symmetry about the ceramic substrate 11 can be stably maintained. That is to say, when the ratio (t1×A1×σ11)/(t2×A2×σ21) at 25° C. is 1.0, 0.85 or greater but less than 1.00, or greater than 1.00 but 1.40 or less; and the ratio (t1×A1×σ12)/(t2×A2×σ22) at 200° C. is greater than 1.0 fold but no more than 1.4 fold as the ratio at 25° C., it is possible to form the symmetric structure about the ceramic substrate 11 appropriately.

FIG. 11 shows process of manufacturing a heat-sink-attached power-module substrate 106 of a sixth embodiment. In this sixth embodiment, the same elements as in the first to fifth embodiments are denoted by the same reference symbols.

Figure 11A:
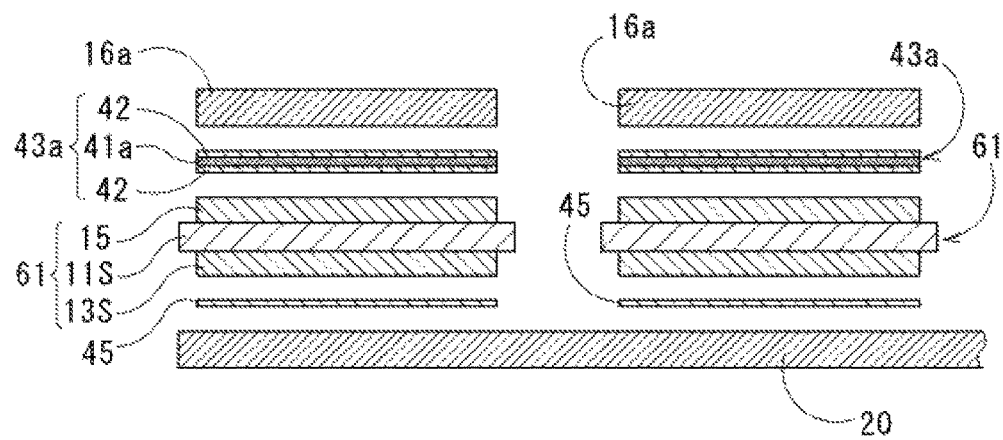
FIG. 11 It is a sectional view showing process of manufacturing a heat-sink-attached power-module substrate according to a sixth embodiment of the present invention.
Figure 11B:
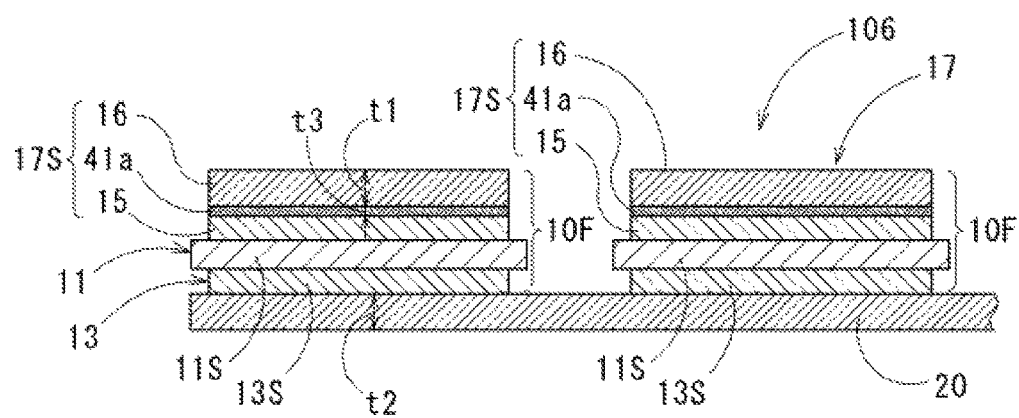

In the heat-sink-attached power-module substrate 106, as shown in FIG. 11B, as in the fifth embodiment, a plurality of power-module substrates 10F are bonded on the one sheet of heat sink 20 with spacing each other, so that the plurality of small-circuit layers 17S are provided and form the circuit layer 17. Specifically, the ceramic substrate 11 is formed from a same number of the small ceramic-substrates 11S as that of the small-circuit layers 17S; the metal layer 13 is formed from a same number of the small-metal layers 13S as that of the small-circuit layers 17S. Each of the power-module substrates 10F is formed by bonding the small-circuit layer 17S and the small-metal layer 13S with interposing the small-ceramic substrate 11S. The first layers 15 and the second layers 16 of the respective small-circuit layers 17S are bonded by the double-side clad brazing members 43a in which the brazing layers 42 are formed on the two surfaces of the circuit-side bonding-core members 41a. The small-metal layers 13S of the power-module substrates 10F and the heat sink 20 are bonded by the brazing material 45 made of Al—Si based alloy or the like, as in the first embodiment. In the double-side clad brazing members 43a, the circuit-side bonding-core members 41a is made of A3003 aluminum alloy by JIS with a thickness of 0.05 mm to 0.6 mm; the brazing layers 42 on the two surfaces are made from Al—Si—Mg based alloy.

In the heat-sink-attached power-module substrate 106 of the sixth embodiment, as in the first bonding process of the first embodiment, bonding the first layers 15 on each surface of the respective small-ceramic substrates 11S and bonding the small-metal layers 13S on the other surface of the small-ceramic substrates 11S by brazing using the brazing material 40, so that the bonded bodies 61 are formed. After this, as shown in FIG. 11A, stacking the second layers 16 on the surfaces of the first layers 15 with interposing the double-side clad brazing members 43a, and stacking the small-metal layers 13S on the heat sink 20 with interposing the brazing materials 45; and these are pressurized in the stacking direction and heated in the non-oxidizing atmosphere such as the nitrogen atmosphere or the like to braze, so that the heat-sink-attached power-module substrate 106 is manufactured. In the heat-sink-attached power-module substrate 106 manufactured as above, as shown in FIG. 11B, thin aluminum alloy layers which were the circuit-side bonding-core members 41a of the double-side clad brazing members 43a were interposed between the first layers 15 and the second layers 16 of the circuit layer 17.

In the heat-sink-attached power-module substrate 106 of the sixth embodiment, when the thickness of the second layers 16 is t1 (mm), the joined-surface area of the second layers 16 is A1 (mm$^2$), the yield strength at 25° C. of the second layers 16 is σ11 (N/mm$^2$), and the yield strength at 200° C. of the second layers 16 is σ12 (N/mm$^2$); the thickness of the heat sink 20 is t2 (mm), the joined-surface area of the heat sink 20 is A2 (mm$^2$), the yield strength at 25° C. of the heat sink 20 is σ21 (N/mm$^2$), and the yield strength at 200° C. of the heat sink 20 is σ22 (N/mm$^2$); and the thickness of the circuit-side bonding-core members 41a is t3 (mm), the joined-surface area of the circuit-side bonding-core members 41a to the first layers 15 is A3 (mm$^2$), the yield strength at 25° C. of the circuit-side bonding-core members 41a is σ31 (N/mm$^2$), and the yield strength at 200° C. of the circuit-side bonding-core members 41a is σ32 (N/mm$^2$), the second layers 16, the circuit-side bonding-core members 41a and the heat sink 20 are controlled in the thicknesses, the joined-surface areas and the yield strength to have a relation below: a ratio (t1×A1×σ11+t3×A3×σ31)/(t2×A2×σ21) at 25° C. is 0.85 to 1.40 inclusive; and a ratio (t1×A1×σ12+t3×A3×σ32)/(t2×A2×σ22) at 200° C. is greater than 1.0 fold but no more than 1.4 fold as the ratio at 25° C.

Accordingly, also in the heat-sink-attached power-module substrate 106, as in the first to fifth embodiments, controlling the ratio at 25° C. and the ratio at 200° C. in the above range, it is possible to reduce the change of the warp amount of the heat-sink-attached power-module substrate 105 in the temperature range of 25° C. to 200° C., so that the symmetry about the ceramic substrate 11 can be stably maintained. That is to say, when the ratio (t1×A1×σ11+t3×A3×σ31)/(t2×A2×σ21) at 25° C. is 1.0, 0.85 or greater but less than 1.00, or greater than 1.00 but 1.40 or less; and the ratio (t1×A1×σ12+t3×A3×σ32)/(t2×A2×σ22) at 200° C. is greater than 1.0 fold but no more than 1.4 fold as the ratio at 25° C., it is possible to form the symmetric structure about the ceramic substrate 11 appropriately.

FIG. 12 shows process of manufacturing a heat-sink-attached power-module substrate 107 of a seventh embodiment. In this seventh embodiment, same parts as in the first to sixth embodiments are denoted by the same reference symbols.

Figure 12A:
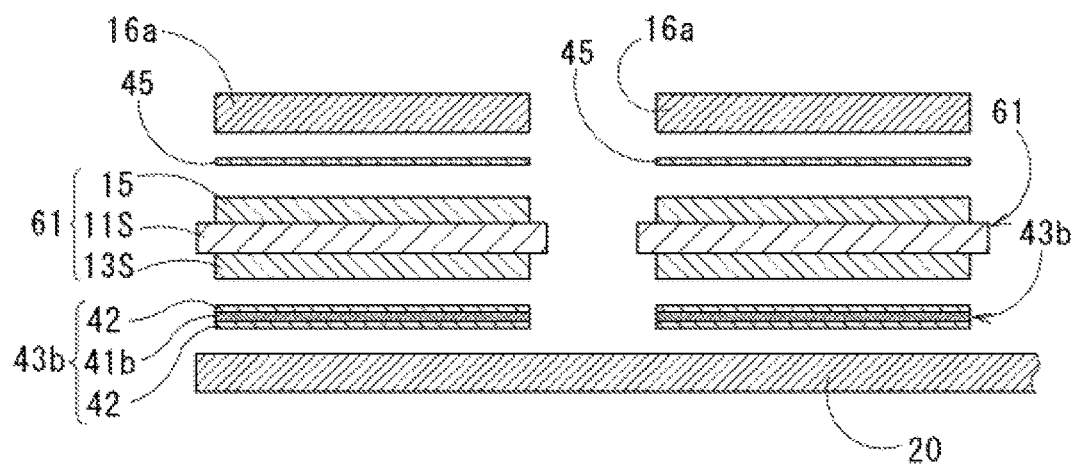
FIG. 12 It is a sectional view showing process of manufacturing a heat-sink-attached power-module substrate according to a seventh embodiment of the present invention.
Figure 12B:
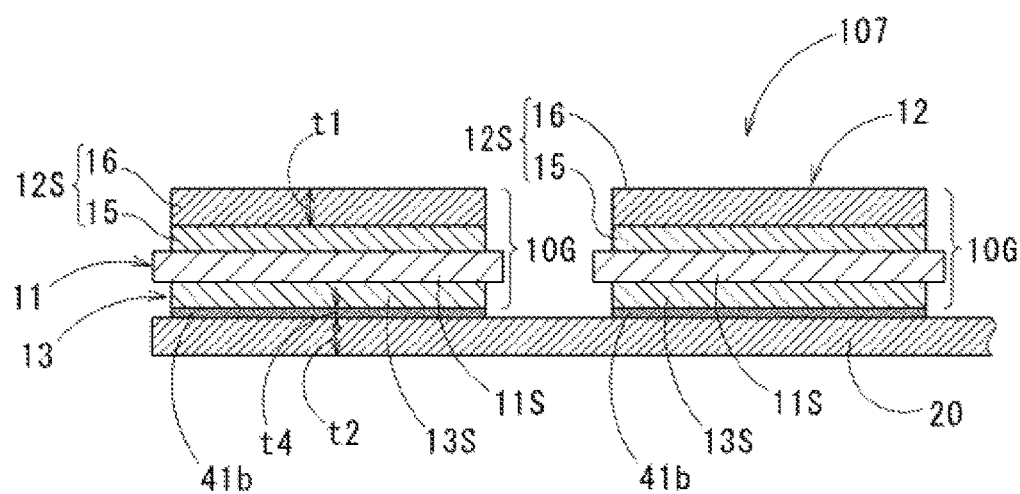

In the heat-sink-attached power-module substrate 107, as shown in FIG. 12B, as in the fifth embodiment and the sixth embodiment, a plurality of power-module substrates 10G are bonded on the one sheet of heat sink 20 with spacing each other, so the plurality of small-circuit layers 12S are formed, and these small-circuit layers 12S form the circuit layer 12. Specifically, the ceramic substrate 11 is formed from the same number of small-ceramic substrates 11S as that of the small-circuit layer 12S; the metal layer 13 is formed from the same number of small-metal layers 13S as that of the small-circuit layers 12S; and each of the power-module substrates 10G is formed by bonding the small-circuit layer 12S and the small-metal layer 13S with the small-ceramic substrate 11S therebetween. The first layers 15 and the second layers 16 of the respective small-circuit layers 12S are, as in the first embodiment, bonded by the brazing material 45 such as Al—Si based alloy or the like. The small-metal layers 13S of the power-module substrates 10G and the heat sink 20 are bonded by the double-side clad brazing members 43b in which the brazing layers 42 are formed on the two surfaces of the heat-radiation-side bonding-core members 41b. In the double-side clad brazing members 43b, the heat-radiation-side bonding-core members 41b are made of A3003 aluminum alloy by JIS with the thickness of 0.05 mm to 0.6 mm; and the brazing layers 42 on the surfaces are made of Al—Si—Mg based alloy.

The heat-sink-attached power-module substrate 107 of the seventh embodiment is manufactured by, as in the first bonding process of the first embodiment, after forming the bonded bodies 61 by bonding the first layer 15 on the one surface of each of the small-ceramic substrates 11S and bonding the small-metal layer 13S on the other surface of the small-ceramic substrate 11S by brazing using the brazing materials 40; as shown in FIG. 12A, stacking the second layers 16 on the surfaces of the first layers 15 with interposing the brazing material 45 and stacking the small-metal layers 13S on the heat sink 20 with interposing the double-side clad brazing members 43b; pressurizing them in the stacking direction; and heating them in the non-oxidizing atmosphere such as the nitrogen atmosphere to braze.

In the heat-sink-attached power-module substrate 107 of the seventh embodiment manufactured as above, as shown in FIG. 12B, thin aluminum layers which were the heat-radiation-side bonding-core members 41b were interposed between the small-metal layers 13S and the heat sink 20.

In the heat-sink-attached power-module substrate 107 of the seventh embodiment, when the thickness of the second layers 16 is t1 (mm), the joined-surface area of the second layers 16 is A1 (mm$^2$), the yield strength at 25° C. of the second layers 16 is σ11 (N/mm$^2$), and the yield strength at 200° C. of the second layers 16 is σ12; the thickness of the heat sink 20 is t2 (mm), the joined-surface area of the heat sink 20 is A2 (mm$^2$), the yield strength at 25° C. of the heat sink 20 is σ21 (N/mm$^2$), and the yield strength at 200° C. of the heat sink 20 is σ22; the thickness of the heat-radiation-side bonding-core members 41b is t4 (mm), the joined-surface area of the heat-radiation-side bonding-core members 41b to the metal layer 13 (the small-metal layers 13S) is A4 (mm$^2$), the yield strength at 25° C. of the heat-radiation-side bonding-core members 41b is σ41 (N/mm$^2$), and the yield strength at 200° C. of the heat-radiation-side bonding-core members 41b is σ42, the second layers 16, the heat sink 20 and the circuit-side bonding-core members 41a are controlled in the thicknesses, the joined-surface areas and the yield strength to have a relation below: a ratio (t1×A1×σ11)/(t2×A2×σ21+t4×A4×σ41) at 25° C. is 0.85 to 1.40 inclusive; and a ratio (t1×A1×σ12)/(t2×A2×σ22+t4×A4×σ42) at 200° C. is greater than 1.0 fold but no more than 1.4 fold as the ratio at 25° C.

Accordingly, also in the heat-sink-attached power-module substrate 107, as in the first to the sixth embodiments, controlling the ratio at 25° C. and the ratio at 200° C. in the above range, it is possible to reduce the change of the warp amount of the heat-sink-attached power-module substrate 107 in the temperature range of 25° C. to 200° C., so that the symmetry about the ceramic substrate 11 can be stably maintained. That is to say, when the ratio (t1×A1×σ11)/(t2×A2×σ21+t4×A4×σ41) at 25° C. is 1.0, 0.85 or greater but less than 1.00, or greater than 1.00 but 1.40 or less; and the ratio (t1×A1×σ12)/(t2×A2×σ22+t4×A4×σ42) at 200° C. is greater than 1.0 fold but no more than 1.4 fold as the ratio at 25° C., it is possible to form the symmetric structure about the ceramic substrate 11 appropriately.

FIG. 13 shows process of manufacturing the heat-sink-attached power-module substrate 108 of the eighth embodiment. In this eighth embodiment, same parts as in the first to the seven embodiments are denoted by the same reference symbols.

Figure 13A:
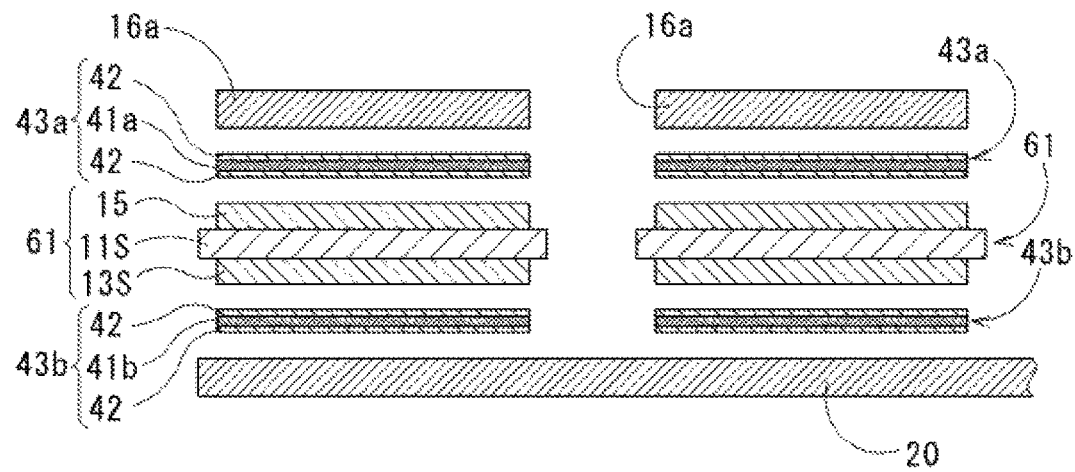
FIG. 13 It is a sectional view showing process of manufacturing a heat-sink-attached power-module substrate according to an eighth embodiment of the present invention.
Figure 13B:
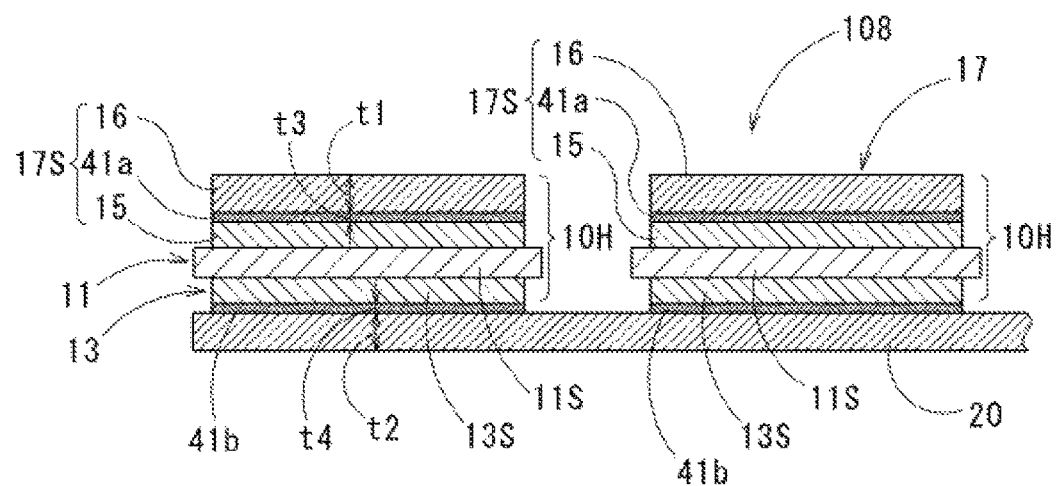

In the heat-sink-attached power-module substrate 108, as shown in FIG. 13B, as in the fifth to seventh embodiments, the plurality of small-metal layers 17S are provided by bonding a plurality of power-module substrates 10H on the one sheet of heat sink 20 with spacing each other, and these small-circuit layers 17S form the circuit layer 17. Specifically, the ceramic substrate 11 is formed from the same number of small-ceramic substrates 11S as that of the small-circuit layers 12S, the metal layer 13 is formed from the same number of small-metal layers 13S as that of the small-circuit layers 12S, and each of the power-module substrates 10H is formed by bonding the small-circuit layer 12S and the small-metal layer 13S with the small-ceramic substrate 11S therebetween. The first layers 15 and the second layers 16 of the small-circuit layers 12S are bonded by the double-side clad brazing members 43a in which the brazing layers 42 are formed on both the surfaces of the circuit-side bonding-core members 41a; the small-metal layers 13S of the respective power-module substrates 10H and the heat sink 20 are bonded by the double-side clad brazing members 43b in which the brazing layers 42 are formed on both surfaces of heat-radiation-side bonding core members 41b. In the respective double-side clad brazing members 43a and 43b, the circuit-side bonding-core members 41a and the heat-radiation-side bonding-core members 41b are made of A3003 aluminum alloy by JIS with the thickness of 0.05 mm to 0.6 mm and the brazing layers 42 on both the surfaces are made of Al—Si—Mg based alloy.

The heat-sink-attached power-module substrate 108 of the eighth embodiment is manufactured by, as in the first bonding process of the first embodiment, after forming the bonded bodies 61 by bonding the first layer 15 on the one surface of each of the small-ceramic substrates 11S and bonding the small-metal layer 13S on the other surface of the small-ceramic substrate 11S by brazing using the brazing materials 40; as shown in FIG. 13A, stacking the second layers 16 on the surfaces of the first layers 15 with interposing the double-side clad brazing members 43a and stacking the small-metal layers 13S on the heat sink 20 with interposing the double-side clad brazing members 43b; pressurizing them in the stacking direction; and heating them in the non-oxidizing atmosphere such as the nitrogen atmosphere to braze.

In the heat-sink-attached power-module substrate 108 of the eighth embodiment manufactured as above, as shown in FIG. 13B, thin aluminum alloy layers which were the circuit-side bonding-core members 41a were interposed between the first layers 15 and the second layers 16, and thin aluminum alloy layers which were the heat-radiation-side bonding core members 41b are interposed between the small-metal layers 13S and the heat sink 20.

In the heat-sink-attached power-module substrate 108 of the eighth embodiment, when the thickness of the second layers 16 is t1 (mm), the joined-surface area of the second layers 16 is A1 (mm$^2$), the yield strength at 25° C. of the second layers 16 is $\sigma$11 (N/mm$^2$), and the yield strength at 200° C. of the second layers 16 is $\sigma$12; the thickness of the heat sink 20 is t2 (mm), the joined-surface area of the heat sink 20 is A2 (mm$^2$), the yield strength at 25° C. of the heat sink 20 is $\sigma$21 (N/mm$^2$), and the yield strength at 200° C. of the heat sink 20 is $\sigma$22; the thickness of the circuit-side bonding-core members 41a is t3 (mm), the joined-surface area of the circuit-side bonding-core members 41a to the first layers 15 is A3 (mm$^2$), the yield strength at 25° C. of the circuit-side bonding-core members 41a is $\sigma$31 (N/mm$^2$), and the yield strength at 200° C. of the circuit-side bonding-core members 41a is $\sigma$32; and the thickness of the heat-radiation-side bonding-core members 41b is t4 (mm), the joined-surface area of the heat-radiation-side bonding-core members 41b to the metal layer 13 (the small-metal layers 13S) is A4 (mm$^2$), the yield strength at 25° C. of the heat-radiation-side bonding-core members 41b is $\sigma$41 (N/mm$^2$), and the yield strength at 200° C. of the heat-radiation-side bonding-core members 41b is $\sigma$42, the second layers 16, the circuit-side bonding-core members 41a, the heat sink 20 and the heat-radiation-side bonding-core members 41b are controlled in the thicknesses, the joined-surface areas and the yield strength to have a relation below: a ratio (t1×A1×$\sigma$11+t3×A3×$\sigma$31)/(t2×A2×$\sigma$21+t4×A4×$\sigma$41) at 25° C. is 0.85 to 1.40 inclusive; and a ratio (t1×A1×$\sigma$12+t3×A3×$\sigma$32)/(t2×A2×$\sigma$22+t4×A4×$\sigma$42) at 200° C. is greater than 1.0 fold but no more than 1.4 fold as the ratio at 25° C.

Accordingly, also in the heat-sink-attached power-module substrate 108, as in the first to the seventh embodiments, controlling the ratio at 25° C. and the ratio at 200° C. in the above range, it is possible to reduce the change of the warp amount of the heat-sink-attached power-module substrate 108 in the temperature range of 25° C. to 200° C., so that the symmetry about the ceramic substrate 11 can be stably maintained. That is to say, when the ratio (t1×A1×$\sigma$11+t3×A3×$\sigma$31)/(t2×A2×$\sigma$21+t4×A4×$\sigma$41) at 25° C. is 1.0, 0.85 or greater but less than 1.00, or greater than 1.00 but 1.40 or less; and the ratio (t1×A1×$\sigma$12+t3×A3×$\sigma$32)/(t2×A2×$\sigma$22+t4×A4×$\sigma$42) at 200° C. is greater than 1.0 fold but no more than 1.4 fold as the ratio at 25° C., it is possible to form the symmetric structure about the ceramic substrate 11 appropriately.

Examples

Next, Examples performed for confirming advantageous effects of the present invention will be explained.

As Invention Examples 1 to 19, ceramic substrates made of AlN with a thickness of 0.635 mm and first layers and metal layers made of 4N—Al with a thickness of 0.6 mm were prepared: second layers of a circuit layer and heat sinks having thicknesses, joined-surface areas, purities, yield strength shown in Table 1 were prepared.

The heat sinks had flat plate shape with a plate size of 60 mm×50 mm in all.

Bonding them by the bonding processes described in the first embodiment to the eighth embodiment, heat-sink-attached power-module substrates were manufactured. Embodiments (bonding methods) in Table 1 show which manufacturing method of the embodiment was applied for manufacturing the respective samples. As Conventional Example 1, a heat-sink-attached power-module substrate was manufactured in which the second layers of the circuit layer were not bonded in the bonding method described in the first embodiment, so that the second layers were not formed.

"Ratio at 25° C." in Table 1 shows below: (t1×A1×$\sigma$11)/(t2×A2×$\sigma$21) when the Embodiment (Bonding Method) is "1" or "5"; (t1×A1×$\sigma$11+t3×A3×$\sigma$31)/(t2×A2×$\sigma$21) when the Embodiment (Bonding Method) is "2" or "6"; (t1×A1×$\sigma$11)/(t2×A2×$\sigma$21+t4×A4×$\sigma$41) when the Embodiment (Bonding Method) is "3" or "7"; and (t1×A1×$\sigma$11+t3×A3×$\sigma$31)/(t2×A2×$\sigma$21+t4×A4×$\sigma$41) when the Embodiment (Bonding Method) is "4" or "8". "Ratio at 200° C." in Table 1 shows below: (t1×A1×$\sigma$12)/(t2×A2×$\sigma$22) when the Embodiment (Bonding Method) is "1" or "5"; (t1×A1×$\sigma$12+t3×A3×$\sigma$32)/(t2×A2×$\sigma$22) when the Embodiment (Bonding Method) is "2" or "6"; (t1×A1×$\sigma$12)/(t2×A2×$\sigma$22+t4×A4×$\sigma$42) when the Embodiment (Bonding Method) is "3" or "7"; and (t1×A1×$\sigma$12+t3×A3×$\sigma$32)/(t2×A2×$\sigma$22+t4×A4×$\sigma$42) when the Embodiment (Bonding Method) is "4" or "8".

"Yield Strength at 25° C." and "Yield Strength at 200° C." with respect to the second layer, the heat sink, the circuit-side bonding-core member and the heat-radiation-side bonding-core member were measured by a method based on JIS standard G0567:2012.

Regarding the respective samples, measured were warp amounts (initial warp) at room temperature (25° C.) after bonding and warp amounts (warp by heating) when heated to 280° C. The warp amounts were evaluated by measuring changes of flatness at back surfaces of the heat sinks using a moire-type three-dimensional shape measuring device. The warp amounts were positive (+) when it warped to be protruded toward the circuit layer side; or negative (−) when it warped to be concave toward the circuit layer side.

Results were shown in Table 1.

TABLE 1

| | | SECOND LAYER IN CIRCUIT LAYER | | | | |
|---|---|---|---|---|---|---|
| SAMPLES | | PLATE THICKNESS t1 (mm) | JOINED-SURFACE AREA A1 (mm$^2$) | ALUMINUM PURITY (mass %) | YIELD STRENGTH AT 25° C. $\sigma$11 (N/mm$^2$) | YIELD STRENGTH AT 200° C. $\sigma$12 (n/mm$^2$) |
| INVENTION EXAMPLES | 1 | 1.0 | 1317 | 97.50 | 50 | 45 |
| | 2 | 1.0 | 1225 | 97.50 | 50 | 45 |

TABLE 1-continued

| | | | | | | |
|---|---|---|---|---|---|---|
| | | 3 | 1.0 | 1155 | 97.50 | 50 | 45 |
| | | 4 | 0.8 | 1225 | 97.50 | 50 | 45 |
| | | 5 | 0.8 | 1317 | 97.50 | 50 | 45 |
| | | 6 | 0.6 | 1225 | 97.50 | 70 | 65 |
| | | 7 | 0.6 | 1225 | 97.50 | 70 | 65 |
| | | 8 | 0.8 | 1317 | 97.50 | 50 | 45 |
| | | 9 | 1.0 | 1317 | 97.50 | 50 | 45 |
| | | 10 | 1.0 | 1317 | 97.50 | 50 | 45 |
| | | 11 | 0.8 | 1317 | 97.50 | 50 | 45 |
| | | 12 | 1.0 | 1225 | 97.50 | 50 | 45 |
| | | 13 | 0.8 | 1225 | 97.50 | 50 | 45 |
| | | 14 | 1.0 | 1317 | 97.50 | 50 | 45 |
| | | 15 | 0.8 | 1317 | 97.50 | 50 | 45 |
| | | 16 | 0.8 | 1317 | 97.50 | 50 | 45 |
| | | 17 | 1.0 | 1317 | 97.50 | 50 | 45 |
| | | 18 | 1.0 | 1317 | 97.50 | 50 | 45 |
| | | 19 | 0.8 | 1317 | 97.50 | 50 | 45 |
| CONVENTIONAL | 1 | 1 | 1317 | 98.00 | 40 | 30 |
| EXAMPLES | 2 | 1.2 | 1317 | 98.00 | 40 | 30 |

| | | HEAT SINK | | | | |
|---|---|---|---|---|---|---|
| SAMPLES | | PLATE THICKNESS t2 (mm) | JOINED-SURFACE AREA A2 (mm$^2$) | ALUMINUM PURITY (mass %) | YIELD STRENGTH AT 25° C. σ21 (N/mm$^2$) | YIELD STRENGTH AT 200° C. σ22 (n/mm$^2$) |
| INVENTION EXAMPLES | 1 | 1.0 | 1369 | 98.00 | 40 | 30 |
| | 2 | 1.0 | 1369 | 98.00 | 40 | 30 |
| | 3 | 1.0 | 1369 | 98.00 | 40 | 30 |
| | 4 | 1.0 | 1369 | 98.00 | 40 | 30 |
| | 5 | 1.0 | 1369 | 99.00 | 35 | 24 |
| | 6 | 0.8 | 1369 | 99.00 | 35 | 24 |
| | 7 | 0.6 | 1369 | 99.00 | 50 | 45 |
| | 8 | 1.0 | 1369 | 98.00 | 40 | 30 |
| | 9 | 0.8 | 1369 | 98.00 | 40 | 30 |
| | 10 | 1.0 | 1369 | 98.00 | 40 | 30 |
| | 11 | 1.0 | 1369 | 99.00 | 35 | 24 |
| | 12 | 0.8 | 1369 | 98.00 | 40 | 30 |
| | 13 | 1.0 | 1369 | 98.00 | 40 | 30 |
| | 14 | 1.0 | 1317 | 98.00 | 40 | 30 |
| | 15 | 1.0 | 1317 | 99.00 | 35 | 24 |
| | 16 | 1.0 | 1317 | 98.00 | 40 | 30 |
| | 17 | 0.8 | 1317 | 98.00 | 40 | 30 |
| | 18 | 1.0 | 1317 | 98.00 | 40 | 30 |
| | 19 | 1.0 | 1317 | 99.00 | 35 | 24 |
| CONVENTIONAL | 1 | 0.8 | 1369 | 97.50 | 50 | 45 |
| EXAMPLES | 2 | 1.0 | 1369 | 93.00 | 40 | 30 |

| | | CIRCUIT-SIDE BONDING-CORE MEMBER | | | | |
|---|---|---|---|---|---|---|
| SAMPLES | | PLATE THICKNESS t3 (mm) | JOINED-SURFACE AREA A3 (mm$^2$) | ALUMINUM PURITY (mass %) | YIELD STRENGTH AT 25° C. σ31 (N/mm$^2$) | YIELD STRENGTH AT 200° C. σ32 (n/mm$^2$) |
| INVENTION EXAMPLES | 1 | — | — | — | — | — |
| | 2 | — | — | — | — | — |
| | 3 | — | — | — | — | — |
| | 4 | — | — | — | — | — |
| | 5 | — | — | — | — | — |
| | 6 | — | — | — | — | — |
| | 7 | — | — | — | — | — |
| | 8 | 0.2 | 1317 | 98.00 | 40 | 30 |
| | 9 | — | — | — | — | — |
| | 10 | 0.2 | 1317 | 98.00 | 40 | 30 |
| | 11 | 0.2 | 1317 | 98.00 | 40 | 30 |
| | 12 | 0.2 | 1317 | 98.00 | 40 | 30 |
| | 13 | 0.2 | 1317 | 98.00 | 40 | 30 |
| | 14 | — | — | — | — | — |
| | 15 | — | — | — | — | — |
| | 16 | 0.2 | 1317 | 98.00 | 40 | 30 |
| | 17 | — | — | — | — | — |
| | 18 | 0.2 | 1317 | 98.00 | 40 | 30 |
| | 19 | 0.2 | 1317 | 98.00 | 40 | 30 |
| CONVENTIONAL | 1 | — | — | — | — | — |
| EXAMPLES | 2 | — | — | — | — | — |

TABLE 1-continued

| | | HEAT-RADIATION-SIDE BONDING-CORE MEMBER | | | | |
|---|---|---|---|---|---|---|
| SAMPLES | | PLATE THICKNESS t4 (mm) | JOINED-SURFACE AREA A4 (mm$^2$) | ALUMINUM PURITY (mass %) | YIELD STRENGTH AT 25° C. σ41 (N/mm$^2$) | YIELD STRENGTH AT 200° C. σ42 (n/mm$^2$) |
| INVENTION EXAMPLES | 1 | — | — | — | — | — |
| | 2 | — | — | — | — | — |
| | 3 | — | — | — | — | — |
| | 4 | — | — | — | — | — |
| | 5 | — | — | — | — | — |
| | 6 | — | — | — | — | — |
| | 7 | — | — | — | — | — |
| | 8 | — | — | — | — | — |
| | 9 | 0.2 | 1369 | 98.00 | 40 | 30 |
| | 10 | 0.2 | 1369 | 98.00 | 40 | 30 |
| | 11 | 0.2 | 1369 | 98.00 | 40 | 30 |
| | 12 | 0.2 | 1369 | 98.00 | 40 | 30 |
| | 13 | 0.2 | 1369 | 98.00 | 40 | 30 |
| | 14 | — | — | — | — | — |
| | 15 | — | — | — | — | — |
| | 16 | — | — | — | — | — |
| | 17 | 0.2 | 1317 | 98.00 | 40 | 30 |
| | 18 | 0.2 | 1317 | 98.00 | 40 | 30 |
| | 19 | 0.2 | 1317 | 98.00 | 40 | 30 |
| CONVENTIONAL EXAMPLES | 1 | — | — | — | — | — |
| | 2 | — | — | — | — | — |

| SAMPLES | | RATIO AT 25° C. (A) | RATIO AT 200° C. (B) | RATIO (B/A) | INITIAL WARP (μm) | WARP BY HEATING (μm) | CHANGE AMOUNT OF WARP (μm) | EMBODIMENT |
|---|---|---|---|---|---|---|---|---|
| INVENTION EXAMPLES | 1 | 1.20 | 1.44 | 1.20 | −40 | −60 | 20 | 1 |
| | 2 | 1.12 | 1.34 | 1.20 | −20 | −40 | 20 | |
| | 3 | 1.05 | 1.27 | 1.20 | 30 | −15 | 45 | 1 |
| | 4 | 0.89 | 1.07 | 1.20 | 35 | −25 | 60 | 1 |
| | 5 | 1.10 | 1.44 | 1.31 | −30 | −45 | 15 | 1 |
| | 6 | 1.34 | 1.82 | 1.35 | −50 | −60 | 10 | 1 |
| | 7 | 0.94 | 0.97 | 1.03 | 30 | −35 | 65 | 1 |
| | 8 | 1.15 | 1.35 | 1.17 | −30 | −50 | 20 | 2 |
| | 9 | 1.20 | 1.44 | 1.20 | −35 | −55 | 20 | 3 |
| | 10 | 1.16 | 1.36 | 1.17 | −25 | −40 | 15 | 4 |
| | 11 | 1.07 | 1.35 | 1.25 | 45 | 25 | 20 | 4 |
| | 12 | 1.31 | 1.53 | 1.17 | −45 | −85 | 20 | 4 |
| | 13 | 0.91 | 1.06 | 1.16 | 45 | −20 | 65 | 4 |
| | 14 | 1.25 | 1.50 | 1.20 | 25 | −40 | 15 | 5 |
| | 15 | 1.14 | 1.50 | 1.31 | 45 | 20 | 25 | 5 |
| | 16 | 1.20 | 1.40 | 1.17 | −20 | −40 | 20 | 6 |
| | 17 | 1.25 | 1.50 | 1.20 | −35 | −60 | 25 | 7 |
| | 18 | 1.21 | 1.42 | 1.17 | −25 | −45 | 20 | 8 |
| | 19 | 1.12 | 1.40 | 1.25 | 45 | 20 | 25 | 8 |
| CONVENTIONAL EXAMPLES | 1 | 0.95 | 0.80 | 0.83 | 65 | −65 | 130 | 1 |
| | 2 | 1.15 | 1.15 | 1.00 | 45 | −55 | 100 | 1 |

As known from Table 1, it was confirmed that the change amounts of warp at room temperature and high temperature were large in Conventional Examples 1 and 2 in which a ratio (B/A) between "Ratio A at 25° C." and "Ratio B at 200° C." were 1.0 or smaller. Meanwhile, it was confirmed that the change amounts of warp at room temperature and high temperature were small in the heat-sink-attached power-module substrates of Invention Examples 1 to 19 in which the ratio (B/A) between "Ratio A at 25° C." and "Ratio B at 200° C." were larger than 1.0.

The present invention is not limited to the above embodiments, various modification may be made without departing from a scope of the present invention. For example, flat plate heat sinks were used in the above embodiments though, it is possible to use a heat sink having a shape in which multi-pin fins or a belt fin are formed on a flat plate part on which the metal layer is bonded. In this case, the thickness t2 of the heat sink is a thickness of the flat plate part.

INDUSTRIAL APPLICABILITY

It is possible to utilize the heat-sink-attached power-module substrate and the power module in which the warp is small even in the mounting process of the semiconductor element or in the usage environment, after bonding of the heat sink.

REFERENCE SIGNS LIST 10A to 10H power-module substrate
11 ceramic substrate
11S small-ceramic substrate
12, 17 circuit layer
12S, 17S small-circuit layer
13 metal layer
13S small-metal layer
13a metal-layer aluminum sheet 15 first layer
15a first-layer aluminum sheets
16 second layer
16a second-layer aluminum sheets
20 heat sink
30 semiconductor element
40, 45 brazing material
41a circuit-side bonding-core member
41b heat-radiation-side bonding-core member
42 brazing layer
43a, 43b double-side clad brazing member
60, 61 bonded body
100 power module
101 to 108 heat-sink-attached power-module substrate
110 pressurizing device

The invention claimed is:

1. A heat-sink-attached power-module substrate comprising:
   one sheet of ceramic substrate;
   a circuit layer formed from a plurality of small-circuit layers which are bonded on one surface of the ceramic substrate with spacing each other;
   one sheet of metal layer bonded on an other surface of the ceramic substrate opposite the one surface of the ceramic substrate;
   a power-module substrate provided with the ceramic substrate, the circuit layer and the metal layer; and
   one sheet of heat sink bonded on the metal layer of the power-module substrate, wherein
   each of the small-circuit layers has a stacking structure configured from a first layer bonded on the ceramic substrate and a second layer bonded on a surface of the first layer:
   the metal layer and the first layers are formed from aluminum sheets having a purity of 99.99 mass % or greater:
   the heat sink and the second layers are formed from aluminum sheets having a purity lower than that of the metal layer and the first layers:
   when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$); and
   a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$),
   a ratio (t1×A1×σ11)/(t2×A2×σ21) at 25° C. is 0.85 to 1.40 inclusive; and
   a ratio (t1×A1×σ12)/(t2×A2×σ22) at 200° C. is greater than 1.0 fold but no more than 1.4 fold as the ratio at 25° C.

2. A heat-sink-attached power-module substrate comprising:
   one sheet of ceramic substrate;
   a circuit layer formed from a plurality of small-circuit layers which are bonded on one surface of the ceramic substrate with spacing each other;
   one sheet of metal layer bonded on an other surface of the ceramic substrate opposite the one surface of the ceramic substrate;
   a power-module substrate provided with the ceramic substrate, the circuit layer and the metal layer; and
   one sheet of heat sink bonded on the metal layer of the power-module substrate, wherein
   each of the small-circuit layers has a stacking structure configured from a first layer bonded on the ceramic substrate, a circuit-side bonding-core member bonded on a surface of the first layer, and a second layer bonded on a surface of the circuit-side bonding-core member:
   the metal layer and the first layers are formed from aluminum sheets having a purity of 99.99 mass % or greater:
   the heat sink and the second layers are formed from aluminum sheets having a purity lower than that of the metal layer and the first layers:
   the circuit-side bonding-core members are formed from aluminum alloy sheets:
   when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$);
   a thickness of the heat sink is t2 (mm), a joined-surface area of the heat sink is A2 (mm$^2$), yield strength of the heat sink at 25° C. is σ21 (N/mm$^2$), and yield strength of the heat sink at 200° C. is σ22 (N/mm$^2$); and
   a thickness of the circuit-side bonding-core members is t3 (mm), a sum total of joined-surface areas of the respective circuit-side bonding-core members and first layers is A3 (mm$^2$), yield strength of the circuit-side bonding-core members at 25° C. is σ31 (N/mm$^2$), and yield strength of the circuit-side bonding-core members at 200° C. is σ32 (N/mm$^2$),
   a ratio (t1×A1×σ11+t3×A3×σ31)/(t2×A2×σ21) at 25° C. is 0.85 to 1.40 inclusive; and
   a ratio (t1×A1×σ12+t3×A3×σ32)/(t2×A2×σ22) at 200° C. is greater than 1.0 fold but no more than 1.4 fold as the ratio at 25° C.

3. A heat-sink-attached power-module substrate comprising:
   one sheet of ceramic substrate;
   a circuit layer formed from a plurality of small-circuit layers which are bonded on one surface of the ceramic substrate with spacing each other;
   one sheet of metal layer bonded on an other surface of the ceramic substrate opposite the one surface of the ceramic substrate;
   a power-module substrate provided with the ceramic substrate, the circuit layer and the metal layer; and
   one sheet of heat sink bonded on the metal layer of the power-module substrate with one sheet of heat-radiation-side bonding-core member therebetween, wherein
   each of the small-circuit layers has a stacking structure configured from a first layer bonded on the ceramic substrate and a second layer bonded on a surface of the first layer:
   the metal layer and the first layers are formed from aluminum sheets having a purity of 99.99 mass % or greater:
   the heat sink and the second layers are formed from aluminum sheets having a purity lower than that of the metal layer and the first layers:
   the heat-radiation-side bonding-core member is formed from an aluminum-alloy sheet:
   when a thickness of the second layers is t1 (mm), a sum total of joined-surface areas of the second layers is A1 (mm$^2$), yield strength of the second layers at 25° C. is σ11 (N/mm$^2$), and yield strength of the second layers at 200° C. is σ12 (N/mm$^2$);
   a thickness of the heat sink is t2 (mm), a joined-surface area of the heat sink is A2 (mm$^2$), yield strength of the heat sink at 25° C. is σ21 (N/mm²), and yield strength of the heat sink at 200° C. is σ22 (N/mm²); and a thickness of the heat-radiation-side bonding-core member is t4 (mm), a joined-surface area of the heat-radiation-side bonding-core member and the metal layer is A4 (mm²), yield strength of the heat-radiation-side bonding-core member at 25° C. is σ41 (N/mm²), and yield strength of the heat-radiation-side bonding-core member at 200° C. is σ42 (N/mm²), a ratio (t1×A1×σ11)/(t2×A2×σ21+t4×A4×σ41) at 25° C. is 0.85 to 1.40 inclusive; and a ratio (t1×A1×σ12)/(t2×A2×σ22+t4×A4×σ42) at 200° C. is greater than 1.0 fold but no more than 1.4 fold as the ratio at 25° C.

4. A heat-sink-attached power-module substrate comprising:

one sheet of ceramic substrate;

a circuit layer formed from a plurality of small-circuit layers which are bonded on one surface of the ceramic substrate spacing each other;

one sheet of metal layer bonded on an other surface of the ceramic substrate opposite the one surface of the ceramic substrate;

a power-module substrate provided with the ceramic substrate, the circuit layer and the metal layer; and one sheet of heat sink bonded on the metal layer of the power-module substrate with one sheet of heat-radiation-side bonding-core member therebetween, wherein each of the small-circuit layers has a stacking structure configured from a first layer bonded on the ceramic substrate, a circuit-side bonding-core member bonded on a surface of the first layer, and a second layer bonded on a surface of the circuit-side bonding-core member:

the metal layer and the first layers are formed from aluminum sheets having a purity of 99.99 mass % or greater:

the heat sink and the second layers are formed from aluminum sheets having a purity lower than that of the metal layer and the first layers:

the heat-radiation-side bonding-core member and the circuit-side bonding-core members are formed from aluminum-alloy sheets:

when a thickness of the second layers is t1 (mm), a sum total of joined-surface areas of the second layers is A1 (mm²), yield strength of the second layers at 25° C. is σ11 (N/mm²), and yield strength of the second layers at 200° C. is σ12 (N/mm²);

a thickness of the heat sink is t2 (mm), a joined-surface area of the heat sink is A2 (mm²), yield strength of the heat sink at 25° C. is σ21 (N/mm²), and yield strength of the heat sink at 200° C. is σ22 (N/mm²);

a thickness of the circuit-side bonding-core members is t3 (mm), a sum total of joined-surface areas of the respective circuit-side bonding-core members and the first layers is A3 (mm²), yield strength of the circuit-side bonding-core members at 25° C. is σ31 (N/mm²), and yield strength of the circuit-side bonding-core members at 200° C. is σ32 (N/mm²); and a thickness of the heat-radiation-side bonding-core member is t4 (mm), a joined-surface area of the heat-radiation-side bonding-core member and the metal layer is A4 (mm²), yield strength of the heat-radiation-side bonding-core member at 25° C. is σ41 (N/mm²), and yield strength of the heat-radiation-side bonding-core member at 200° C. is σ42 (N/mm²), a ratio (t1×A1×σ11+t3×A3×σ31)/(t2×A2×σ21+t4×A4×σ41) at 25° C. is 0.85 to 1.40 inclusive; and a ratio (t1×A1×σ12+t3×A3×σ32)/(t2×A2×σ22+t4×A4×σ42) at 200° C. is greater than 1.0 fold but no more than 1.4 fold as the ratio at 25° C.

5. A heat-sink-attached power-module substrate comprising a plurality of power-module substrates and one sheet of heat sink on which the power-module substrates are bonded with spacing each other, wherein each of the power-module substrates is provided with a small-ceramic substrate, a small-circuit layer bonded on one surface of the small-ceramic substrate and a small-metal layer bonded on an other surface of the small-ceramic substrate opposite the one surface of the small-ceramic substrate, wherein the respective small-metal layers of the power-module substrates are bonded on the heat sink;

each of the small-circuit layers has a stacking structure configured from a first layer bonded on the small-ceramic substrate and a second layer bonded on a surface of the first layer;

the small-metal layers and the first layers are formed from aluminum sheets having a purity of 99.99 mass % or greater;

the heat sink and the second layers are formed from aluminum sheets having a purity lower than that of the small-metal layers and the first layers;

when a thickness of the second layers is t1 (mm), a sum total of joined-surface areas of the second layers is A1 (mm²), yield strength of the second layers at 25° C. is σ11 (N/mm²), and yield strength of the second layers at 200° C. is σ12 (N/mm²); and a thickness of the heat sink is t2 (mm), a joined-surface area of the heat sink is A2 (mm²), yield strength of the heat sink at 25° C. is σ21 (N/mm²), and yield strength of the heat sink at 200° C. is σ22 (N/mm²), a ratio (t1×A1×σ11)/(t2×A2×σ21) at 25° C. is 0.85 to 1.40 inclusive; and a ratio (t1×A1×σ12)/(t2×A2×σ22) at 200° C. is greater than 1.0 fold but no more than 1.4 fold as the ratio at 25° C.

6. A heat-sink-attached power-module substrate comprising a plurality of power-module substrates and one sheet of heat sink on which the power-module substrates are bonded with spacing each other, wherein each of the power-module substrates is provided with a small-ceramic substrate, a small-circuit layer bonded on one surface of the small-ceramic substrate and a small-metal layer bonded on an other surface of the small-ceramic substrate opposite the one surface of the small-ceramic substrate, wherein the respective small-metal layers of the power-module substrates are bonded on the heat sink;

each of the small-circuit layers has a stacking structure configured from a first layer bonded on the small-ceramic substrate, a circuit-side bonding-core member bonded on a surface of the first layer and a second layer bonded on a surface of the circuit-side boning-core member, the small-metal layers and the first layers are formed from aluminum sheets having a purity of 99.99 mass % or greater, the heat sink and the second layers are formed from aluminum sheets having a purity lower than that of the small-metal layers and the first layers, the circuit-side bonding-core members are formed from aluminum-alloy sheets, when a thickness of the second layers is t1 (mm), a sum total of joined-surface areas of the second layers is A1

(mm$^2$), yield strength of the second layers at 25° C. is $\sigma 11$ (N/mm$^2$), and yield strength of the second layers at 200° C. is $\sigma 12$ (N/mm$^2$);

a thickness of the heat sink is t2 (mm), a joined-surface area of the heat sink is A2 (mm$^2$), yield strength of the heat sink at 25° C. is $\sigma 21$ (N/mm$^2$), and yield strength of the heat sink at 200° C. is $\sigma 22$ (N/mm$^2$); and a thickness of the circuit-side bonding-core members is t3 (mm), a sum total of joined-surface areas of the respective circuit-side bonding-core members and first layers is A3 (mm$^2$), yield strength of the circuit-side bonding-core members at 25° C. is $\sigma 31$ (N/mm$^2$), and yield strength of the circuit-side bonding-core members at 200° C. is $\sigma 32$ (N/mm$^2$), a ratio (t1×A1×$\sigma$11+t3×A3×$\sigma$31)/(t2×A2×$\sigma$21) at 25° C. is 0.85 to 1.40 inclusive; and a ratio (t1×A1×$\sigma$12+t3×A3×$\sigma$32)/(t2×A2×$\sigma$22) at 200° C. is greater than 1.0 fold but no more than 1.4 fold as the ratio at 25° C.

7. A heat-sink-attached power-module substrate comprising a plurality of power-module substrates and one sheet of heat sink on which the power-module substrates are bonded with spacing each other, wherein each of the power-module substrates is provided with a small-ceramic substrate, a small-circuit layer bonded on one surface of the small-ceramic substrate, and a small-metal layer bonded on an other surface of the small-ceramic substrate opposite the one surface of the small-ceramic substrate, wherein the respective small-metal layers of the power-module substrates are bonded on the heat sink with interposing heat-radiation-side bonding-core members therebetween, each of the small-circuit layers has a stacking structure configured from a first layer bonded on the small-ceramic substrate and a second layer bonded on a surface of the first layer, the small-metal layers and the first layers are formed from aluminum sheets having a purity of 99.99 mass % or greater, the heat sink and the second layers are formed from aluminum sheets having a purity lower than that of the small-metal layers and the first layers, and the heat-radiation-side bonding-core members are formed from aluminum-alloy sheets, when a thickness of the second layers is t1 (mm), a sum total of joined-surface areas of the second layers is A1 (mm$^2$), yield strength of the second layers at 25° C. is $\sigma 11$ (N/mm$^2$), and yield strength of the second layers at 200° C. is $\sigma 12$ (N/mm$^2$);

a thickness of the heat sink is t2 (mm), a joined-surface area of the heat sink is A2 (mm$^2$), yield strength of the heat sink at 25° C. is $\sigma 21$ (N/mm$^2$), and yield strength of the heat sink at 200° C. is $\sigma 22$ (N/mm$^2$); and a thickness of the heat-radiation-side bonding-core members is t4 (mm), a sum total of joined-surface areas of the respective heat-radiation-side bonding-core members and the small-metal layers is A4 (mm$^2$), yield strength of the heat-radiation-side bonding-core members at 25° C. is $\sigma 41$ (N/mm$^2$), and yield strength of the heat-radiation-side bonding-core members at 200° C. is $\sigma 42$ (N/mm$^2$), a ratio (t1×A1×$\sigma$11)/(t2×A2×$\sigma$21+t4×A4×$\sigma$41) at 25° C. is 0.85 to 1.40 inclusive; and a ratio (t1×A1×$\sigma$12)/(t2×A2×$\sigma$22+t4×A4×$\sigma$42) at 200° C. is greater than 1.0 fold but no more than 1.4 fold as the ratio at 25° C.

8. A heat-sink-attached power-module substrate comprising a plurality of power-module substrates and one sheet of heat sink on which the power-module substrates are bonded with spacing each other, wherein each of the power-module substrates is provided with a small-ceramic substrate, a small-circuit layer bonded on one surface of the small-ceramic substrate, and a small-metal layer bonded on an other surface of the small-ceramic substrate opposite the one surface of the small-ceramic substrate, wherein the respective small-metal layers of the power-module substrates are bonded on the heat sink with interposing heat-radiation-side bonding-core members therebetween, each of the small-circuit layers has a stacking structure configured from a first layer bonded on the small-ceramic substrate, a circuit-side bonding-core member bonded on a surface of the first layer, and a second layer bonded on a surface of the circuit-side bonding-core member, the small-metal layers and the first layers are formed from aluminum sheets having a purity of 99.99 mass % or greater, the heat sink and the second layers are formed from aluminum sheets having a purity lower than that of the small-metal layers and the first layers, the heat-radiation-side bonding-core members and the circuit-side bonding-core members are formed from aluminum-alloy sheets, when a thickness of the second layers is t1 (mm), a sum total of joined-surface areas of the second layers is A1 (mm$^2$), yield strength of the second layers at 25° C. is $\sigma 11$ (N/mm$^2$), and yield strength of the second layers at 200° C. is $\sigma 12$ (N/mm$^2$);

a thickness of the heat sink is t2 (mm), a joined-surface area of the heat sink is A2 (mm$^2$), yield strength of the heat sink at 25° C. is $\sigma 21$ (N/mm$^2$), and yield strength of the heat sink at 200° C. is $\sigma 22$ (N/mm$^2$);

a thickness of the circuit-side bonding-core members is t3 (mm), a sum total of joined-surface areas of the respective circuit-side bonding-core members and the first layers is A3 (mm$^2$), yield strength of the circuit-side bonding-core members at 25° C. is $\sigma 31$ (N/mm$^2$), and yield strength of the circuit-side bonding-core members at 200° C. is $\sigma 32$ (N/mm$^2$); and a thickness of the heat-radiation-side bonding-core members is t4 (mm), a sum total of joined-surface areas of the respective heat-radiation-side bonding-core members and the small-metal layers is A4 (mm$^2$), yield strength of the heat-radiation-side bonding-core members at 25° C. is $\sigma 41$ (N/mm$^2$), and yield strength of the heat-radiation-side bonding-core members at 200° C. is $\sigma 42$ (N/mm$^2$), a ratio (t1×A1×$\sigma$11+t3×A3×$\sigma$31)/(t2×A2×$\sigma$21+t4×A4×$\sigma$41) at 25° C. is 0.85 to 1.40 inclusive; and a ratio (t1×A1×$\sigma$12+t3×A3×$\sigma$32)/(t2×A2×$\sigma$22+t4×A4×$\sigma$42) at 200° C. is greater than 1.0 but no more than 1.4 of the ratio at 25° C.

9. The heat-sink-attached power-module substrate according to claim 1, wherein the second layers are formed from aluminum sheet having larger yield strength at 200° C. than that of the heat sink.

10. The heat-sink-attached power-module substrate according to claim 1, wherein the second layers are formed from aluminum sheets having a purity lower than 99.90 mass %, and the heat sink is formed from an aluminum sheet having a purity of 99.90 mass % or lower.

11. A power module comprising:
the heat-sink-attached power-module substrate according to claim 1, and
a semiconductor element mounted on a surface of at least one of the small-circuit layers.

12. The heat-sink-attached power-module substrate according to claim 2, wherein the second layers are formed from aluminum sheet having larger yield strength at 200° C. than that of the heat sink.

13. The heat-sink-attached power-module substrate according to claim 5, wherein the second layers are formed from aluminum sheet having larger yield strength at 200° C. than that of the heat sink.

14. The heat-sink-attached power-module substrate according to claim 6, wherein the second layers are formed from aluminum sheet having larger yield strength at 200° C. than that of the heat sink.

15. The heat-sink-attached power-module substrate according to claim 2, wherein the second layers are formed from aluminum sheets having a purity lower than 99.90 mass %, and the heat sink is formed from an aluminum sheet having a purity of 99.90 mass % or lower.

16. The heat-sink-attached power-module substrate according to claim 5, wherein the second layers are formed from aluminum sheets having a purity lower than 99.90 mass %, and the heat sink is formed from an aluminum sheet having a purity of 99.90 mass % or lower.

17. The heat-sink-attached power-module substrate according to claim 6, wherein the second layers are formed from aluminum sheets having a purity lower than 99.90 mass %, and the heat sink is formed from an aluminum sheet having a purity of 99.90 mass % or lower.

18. A power module comprising:
the heat-sink-attached power-module substrate according to claim 2, and
a semiconductor element mounted on a surface of at least one of the small-circuit layers.

19. A power module comprising:
the heat-sink-attached power-module substrate according to claim 5, and
a semiconductor element mounted on a surface of at least one of the small-circuit layers.

20. A power module comprising:
the heat-sink-attached power-module substrate according to claim 6, and
a semiconductor element mounted on a surface of at least one of the small-circuit layers.

* * * * *